(12) United States Patent
Tsuchizawa

(10) Patent No.: US 8,473,770 B2
(45) Date of Patent: Jun. 25, 2013

(54) SEMICONDUCTOR DEVICE AND DATA PROCESSING SYSTEM

(75) Inventor: Shigeru Tsuchizawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 428 days.

(21) Appl. No.: 12/794,752

(22) Filed: Jun. 6, 2010

(65) Prior Publication Data

US 2010/0318830 A1    Dec. 16, 2010

(30) Foreign Application Priority Data

Jun. 15, 2009   (JP) ................................. 2009-142631

(51) Int. Cl.
G06F 1/12 (2006.01)
G06F 1/04 (2006.01)
G06F 1/06 (2006.01)
G06F 1/08 (2006.01)

(52) U.S. Cl.
USPC ........... 713/400; 713/500; 713/501; 713/502; 713/503

(58) Field of Classification Search
None
See application file for complete search history.

(56) References Cited

U.S. PATENT DOCUMENTS

| 7,187,727 | B2 | 3/2007 | Saeki |
| 7,634,035 | B2 | 12/2009 | Kuwata |
| 2005/0135527 | A1 | 6/2005 | Masui et al. |
| 2006/0227916 | A1 | 10/2006 | Masui et al. |
| 2010/0039156 | A1* | 2/2010 | Yamaguchi .................. 327/291 |
| 2010/0318830 | A1* | 12/2010 | Tsuchizawa .................. 713/375 |

FOREIGN PATENT DOCUMENTS

| JP | 2002-190724 A | 7/2002 |
| JP | 2004-328063 | * 11/2004 |
| JP | 2005-192192 A | 7/2005 |
| JP | 2006-262165 A | 9/2006 |
| JP | 4077454 B2 | 2/2008 |

* cited by examiner

*Primary Examiner* — Tanh Nguyen
(74) *Attorney, Agent, or Firm* — Miles & Stockbridge P.C.

(57) ABSTRACT

There is provided a serial reception circuit that can suppress the occurrence of a bit error due to long-period jitter while suppressing the power consumption. A serial reception circuit for receiving a serial signal in synchronization with a clock signal samples the serial signal in synchronization with multiphase sampling clock signals out of phase with the clock signal, determines based on sampled signals that a sampling phase having little effect of phase variation of the serial signal on a sampling result is an optimum phase, performs a reception operation in which a signal sampled by the optimum phase is reception data, and has, as determination operations for the optimum phase, a first mode and a second mode in which optimality of an optimum phase determined in the first mode is determined based on a sampling result of a reduced number of samplings.

20 Claims, 14 Drawing Sheets

FIG. 7

DETAILS OF DECODER

| INITIAL PHASE DETECTION ON | PHASE TRACKING ON | PHASE SELECTION SIGNAL | CE(1) | CE(2) | CE(3) | CE(4) | CE(5) | CE(6) | CE(7) | CE(8) |
|---|---|---|---|---|---|---|---|---|---|---|
| TRUE | DON'T CARE | DON'T CARE | HIGH | HIGH | HIGH | HIGH | HIGH | HIGH | HIGH | HIGH |
| FALSE | FALSE | DON'T CARE | LOW | LOW | LOW | LOW | LOW | LOW | LOW | LOW |
| FALSE | TRUE | PHASE(1) | HIGH | HIGH | HIGH | LOW | LOW | LOW | LOW | LOW |
| FALSE | TRUE | PHASE(2) | HIGH | HIGH | HIGH | HIGH | LOW | LOW | LOW | HIGH |
| FALSE | TRUE | PHASE(3) | HIGH | HIGH | HIGH | HIGH | HIGH | LOW | LOW | HIGH |
| FALSE | TRUE | PHASE(4) | LOW | HIGH | HIGH | HIGH | HIGH | HIGH | LOW | HIGH |
| FALSE | TRUE | PHASE(5) | LOW | LOW | HIGH | HIGH | HIGH | HIGH | HIGH | LOW |
| FALSE | TRUE | PHASE(6) | LOW | LOW | LOW | HIGH | HIGH | HIGH | HIGH | LOW |
| FALSE | TRUE | PHASE(7) | HIGH | LOW | LOW | LOW | HIGH | HIGH | HIGH | HIGH |
| FALSE | TRUE | PHASE(8) | HIGH | HIGH | LOW | LOW | LOW | HIGH | HIGH | HIGH |

SEMICONDUCTOR DEVICE AND DATA PROCESSING SYSTEM

CROSS-REFERENCE TO RELATED APPLICATIONS

The disclosure of Japanese Patent Application No. 2009-142631 filed on Jun. 15, 2009 including the specification, drawings and abstract is incorporated herein by reference in its entirety.

BACKGROUND OF THE INVENTION

The present invention relates to a semiconductor device including a serial reception circuit for oversampling a received serial signal with a plurality of multiphase clock signals having the same frequency but different phases to extract data and a data processing system, and to a technique effective when applied to e.g. a digital mobile phone system.

In electrical signals such as serial data of transmission signals and sampling clocks in reception circuits, time-base fluctuation in picoseconds or nanoseconds called jitter exists, and becomes a primary cause of transmission bit errors in high-speed transmission exceeding hundreds of megahertz. The causes of jitter include thermal noise of electrons and variation in propagation delay amount of an electronic circuit element due to power supply voltage or temperature variation. The jitter is classified into a plurality of parameters according to factor and fluctuation characteristics, and also treated differently according to measurement methods and technical fields. Random jitter is a jitter component of short-time nonperiodic fluctuation. The random jitter is strictly limited in a transmission standard, and taken into due consideration during circuit design. In addition, there exists another jitter component having periodicity associated with a clock frequency of an electrical circuit. Since such periodic jitter (in particular, a long-period component is also called wander) also impedes long-time continuation of stable transmission, a technique called CDR (Clock and Data Recovery) is required for the reception circuit of high-speed serial transmission.

The CDR is an electrical signal transmission technique for separating and extracting a data component and a clock component having an optimum phase relationship from an input serial signal, and is often used in a high-speed differential signal serial communication field. The CDR can be classified broadly into two methods.

The first method is a phase synchronization method using a PLL (Phase Locked Loop). In this method, the phase difference between a changing point of received serial data and a sampling clock edge is detected, and an incorporated VCO (Voltage Control Oscillator) is controlled by a charge pump, thereby reproducing a clock component synchronized with the serial data. The serial data is sampled based on the reproduced clock, thereby making it possible to reproduce a reception signal. In a narrow sense, the CDR often denotes the phase synchronization method. Japanese Patent Publication No. 4077454 describes a conventional technique using the PLL.

The second method is a phase interpolation method for oversampling received serial data with a plurality of multiphase clock signals having the same frequency but different phases. N multiphase clocks are generated from a reference clock, thereby obtaining N lines of sample data, using flip-flops. Then, a data signal having an optimum phase relationship with the clock is selected through digital signal processing, thus obtaining a reception signal. In general, the phase interpolation method facilitates the implementation and reduces the power consumption as compared to the phase synchronization method using the PLL. Japanese Unexamined Patent Publication No. 2002-190724, Japanese Unexamined Patent Publication No. 2005-192192, and Japanese Unexamined Patent Publication No. 2006-262165 describes conventional techniques using oversampling.

SUMMARY OF THE INVENTION

In the phase synchronization method, generally several hundred to several thousand clock cycles in duration are required until the VCO (Voltage Control Oscillator) in the PLL circuit synchronizes with received serial data. Therefore, it is difficult to support a standard that requires a reception start in a short time after reception signal input. Further, the consumption current of the VCO tends to increase with increasing speed, so that it is unappropriate to mount many VCOs in a device such as a mobile terminal required to have low power consumption. Particularly in the case of mounting a plurality of differential links, as many VCOs as reception circuits are required, which increases the total consumption current.

On the other hand, the phase interpolation method does not require a VCO dedicated to each reception circuit. Therefore, particularly in the case of mounting a plurality of serial communication channels (differential links), it allows the implementation with a lower consumption current than that of the phase synchronization method. Further, since an optimum phase is determined based on a signal actually observed by oversampling, it is possible to synchronize with serial data at a very high speed of several to several dozen clock cycles. However, in the conventional phase interpolation method, an optimum phase is determined by pattern matching to a unique code attached to a frame start, circuit configurations have to differ according to patterns. For example, to support a plurality of communication protocols, corresponding circuit configurations for determining optimum phases have to be provided to the respective communication protocols.

Further, with recent needs for higher transmission rates, there are growing demands for increasing the phase accuracy of multiphase clocks and the number of clock phases. The increased number of clock phases leads to an increase in the circuit area, which makes it difficult to acquire the merit of the lower consumption current.

Further, even though an optimum phase is determined at the start of a communication frame, the optimum phase may change in the middle of the frame due to time-dependent change in transmission path characteristics, which cannot be dealt with by specific pattern matching. An example of the time-dependent change in transmission path characteristics is a phenomenon in which the propagation delay amount of an analog element (used for a serial data input buffer or the like) is increased and decreased due to power supply voltage variation. The propagation delay amount of the analog element tends to increase with decrease in the power supply voltage and decrease with increase in the power supply voltage. Such a tendency of the element causes long-period jitter, which may cause a bit error in the middle of communication if an optimum phase cannot be redetermined until the next frame. It is necessary to track long-period jitter by dynamically selecting an optimum clock signal. Further, since a new operation for dynamically tracking an optimum clock signal is added, it is necessary to further reduce the power consumption.

It is an object of the present invention to provide a semiconductor device including a serial reception circuit that can suppress the occurrence of a bit error due to long-period jitter while suppressing the power consumption.

It is another object of the invention to provide a data processing system that can suppress the occurrence of a bit error due to long-period jitter while suppressing the power consumption in a serial interface between semiconductor devices.

The above and other objects and novel features of the present invention will become apparent from the description of this specification and the accompanying drawings.

A typical aspect of the invention disclosed in the present application will be briefly described as follows.

A serial reception circuit for receiving a serial signal in synchronization with a clock signal samples the serial signal in synchronization with multiphase sampling clock signals out of phase with the clock signal, determines based on sampled signals that a sampling phase having little effect of phase variation of the serial signal on a sampling result is an optimum phase, performs a reception operation in which a signal sampled by the optimum phase is reception data, and has, as determination operations for the optimum phase, a first mode and a second mode in which optimality of an optimum phase determined in the first mode is determined based on a sampling result of a reduced number of samplings.

This makes it possible to update an optimum phase for data sampling in the middle of a reception operation, which can suppress the occurrence of a bit error due to long-period jitter. Further, since the phase shift due to long-period jitter occurs stepwise and slowly; once an optimum phase is determined in the first mode, the sampling result of a reduced number of samplings can be sufficient to determine an optimum phase, which leads to a reduction in the calculation amount, thereby reducing the power consumption.

A typical effect of the invention disclosed in the present application will be briefly described as follows.

It is possible to suppress the occurrence of a bit error due to long-period jitter while suppressing the power consumption in serial reception synchronized with a clock.

BRIEF DESCRIPTION OF THE DRAWINGS

FIG. 7 is a table illustrating the generation logic of clock enable signals CE(1) to CE(N) by a decoder.

DESCRIPTION OF THE PREFERRED EMBODIMENTS

1. Summary of Embodiments

Figure 1:
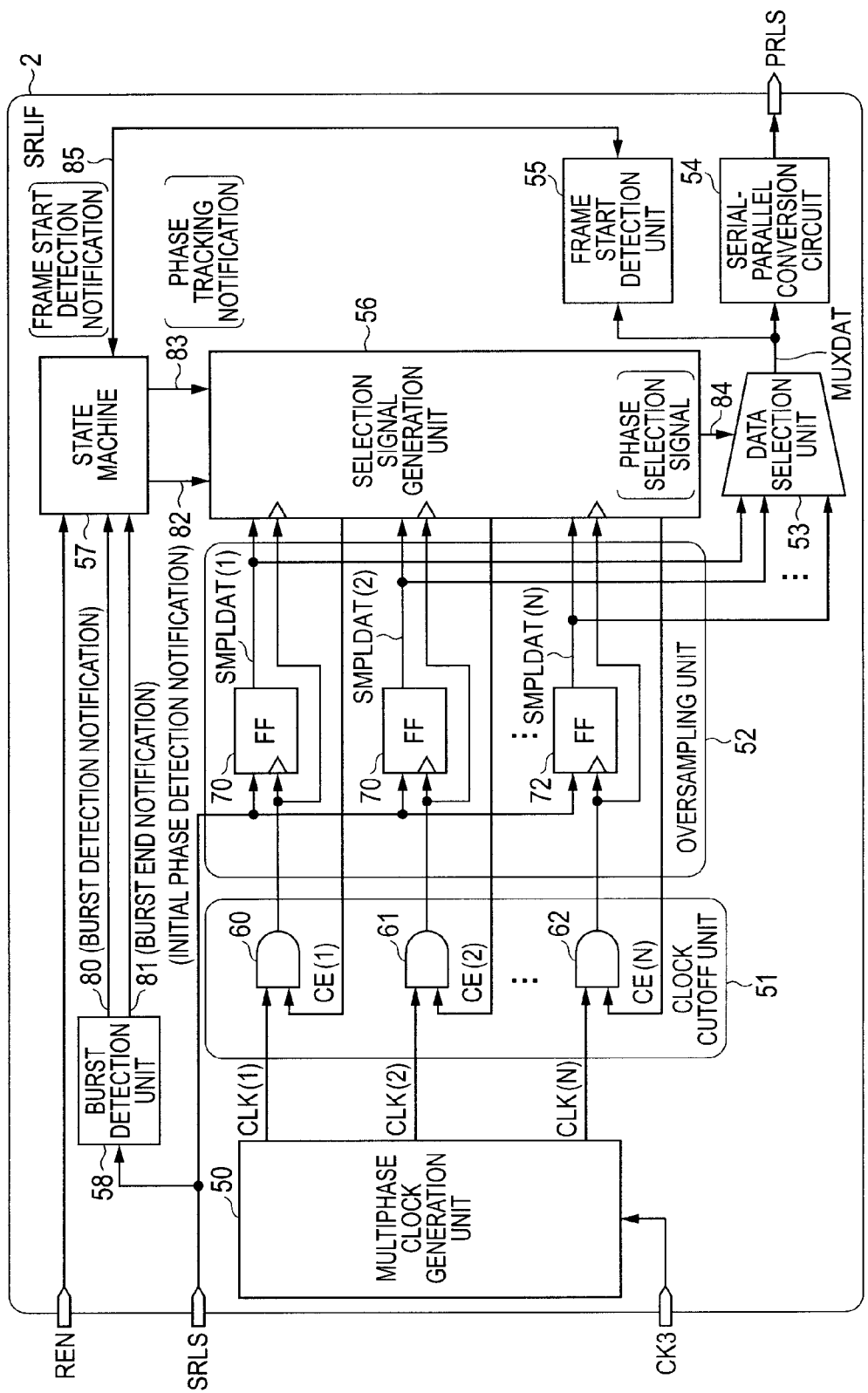
FIG. 1 is a block diagram illustrating the configuration of a serial reception circuit.

Summaries of typical embodiments of the invention disclosed in the present application will first be explained. Reference numerals in the drawings that refer to with parentheses applied thereto in the description of the summaries of the typical embodiments are merely illustration of ones contained in the concepts of components marked with the reference numerals.

[1] Initial Detection and Change Tracking of Sampling Phase

A semiconductor device according to a typical embodiment of the invention includes a serial reception circuit for receiving a serial signal in synchronization with a clock signal (CK3). The serial reception circuit samples the serial signal (SRLS) in synchronization with multiphase sampling clock signals (CLK(1) to CLK(N)) out of phase with the clock signal, determines based on sampled signals that a sampling phase having little effect of phase variation of the serial signal on a sampling result is an optimum phase, performs a reception operation in which a signal sampled by the optimum phase is reception data, and has, as determination operations for the optimum phase, a first mode (initial phase detection mode) and a second mode (phase tracking mode) in which optimality of an optimum phase determined in the first mode is determined based on a sampling result of a reduced number of samplings.

This makes it possible to update an optimum phase for data sampling in the middle of a reception operation, which can suppress the occurrence of a bit error due to long-period jitter. Further, since the phase shift due to long-period jitter occurs stepwise and slowly; once an optimum phase is determined in the first mode, the sampling result of a reduced number of samplings can be sufficient to determine an optimum phase, which leads to a reduction in the calculation amount, thereby reducing the power consumption.

[2] Determination Operation Cycle

In the semiconductor device according to paragraph 1, a cycle of the determination operation in the second mode is longer than a cycle of the determination operation in the first mode. Since long-period jitter may change a determined optimum phase to an adjacent sample phase at most, the longer cycle of the determination operation in the second mode does not cause a bit error and can further reduce the power consumption.

[3] Determination Logic

In the semiconductor device according to paragraph 2, the serial reception circuit integrates the number of times that sampled signals in each group according to the type of sampling phase do not match sample signals of immediately preceding sample phases respectively in a predetermined plurality of cycles of the clock signal, and determines that a sampling phase that is of a smaller integration value and has adjacent sampling phases of smaller integration values is the optimum phase.

According to this, a sampling phase having no effect of phase variation of the serial signal is determined based on the match/mismatch between adjacent sample signals, but comparison with a known symbol pattern is not made to determine an optimum sampling phase. Therefore, it is possible to widely and easily support serial reception of various communication protocols.

[4] Determination Logic with Weights

In the semiconductor device according to paragraph 3, the serial reception circuit calculates a score (SCORE(n)) for each sampling phase to be determined, in which an integration value of a sampling phase to be determined is evaluated with a first large weight, and other sampling clock signals are each evaluated with a respective weight which is larger as a respective phase is closer to the sampling phase to be determined and which is smaller than the first weight. The evaluation with weights facilitates increasing the accuracy of the determination.

[5] Sampling with Synchronization Pattern

In the semiconductor device according to paragraph 4, the serial reception circuit receives the serial signal frame by frame, makes a determination of the first mode, using a synchronization pattern attached before a frame, and makes a determination of the second mode by detecting a frame delimiter pattern provided at the start of the frame. This allows the entire frame including the frame delimiter pattern to be received without an error. The form of the synchronization pattern that can support the foregoing is not limited according to paragraph 2.

[6] Initial Phase Detection Before Frame Delimiter Pattern

In the semiconductor device according to paragraph 5, the serial reception circuit includes an oversampling unit (52) for sampling the serial signal in synchronization with multiphase sampling clock signals out of phase with the clock signal, a determination unit (56) for determining based on sample data sampled by the oversampling unit that one sampling phase having little effect of phase variation of the serial signal on a sampling result is an optimum phase, a selection unit (53) for selecting a signal, as reception data, sampled by a sampling clock signal of the optimum phase determined by the determination unit, and a control unit (57) for operating the determination unit in the first mode in response to detection of the synchronization pattern and operating the determination unit in the second mode in response to detection of the frame delimiter pattern.

[7] Determination Logic

In the semiconductor device according to paragraph 6, the determination unit integrates the number of times that sample data items in each group according to the type of sampling clock signal do not match sample data items of immediately preceding phases respectively in a predetermined plurality of cycles of the clock signal, and determines that a sampling clock signal that is of a smaller integration value and has adjacent phase sampling clock signals of smaller integration values is a sampling clock signal of the optimum phase.

[8] Determination Logic with Weights

In the semiconductor device according to paragraph 7, the determination unit calculates a score for each sampling clock signal to be determined, in which an integration value of a sampling clock signal to be determined is evaluated with a first large weight, and other sampling clock signals are each evaluated with a respective weight which is larger as a respective phase is closer to the sampling clock signal to be determined and which is smaller than the first weight.

[9]

In the semiconductor device according to paragraph 8, a value obtained by multiplying the number of sampling clock signal types by the predetermined number of cycles of the clock signal is smaller than a cycle number of the clock signal in the synchronization pattern. The detection of an optimum sampling phase can be completed before the frame delimiter pattern.

[10] Initial Phase Detection and Optimum Phase Tracking

A semiconductor device according to another embodiment of the invention includes a serial reception circuit for receiving a serial signal in synchronization with a clock signal. The serial reception circuit includes an oversampling unit for sampling the serial signal in synchronization with multiphase sampling clock signals out of phase with the clock signal, a determination unit for determining based on sample data sampled by the oversampling unit that one sampling phase having little effect of phase variation of the serial signal on a sampling result is an optimum phase, a selection unit for selecting a signal, as reception data, sampled by a sampling clock signal of the optimum phase determined by the determination unit, and a control unit for operating the determination unit in a first mode in response to input detection of the serial signal and operating the determination unit in a second mode in which optimality of an optimum phase determined in the first mode is determined based on a sampling result of a reduced number of samplings, in response to detection of a predetermined pattern contained in the serial signal.

[11] Determination Logic

In the semiconductor device according to paragraph 10, the determination unit integrates the number of times that sample data items in each group according to the type of sampling clock signal do not match sample data items of immediately preceding phases respectively in a predetermined plurality of cycles of the clock signal, and determines that a sampling clock signal that is of a smaller integration value and has adjacent phase sampling clock signals of smaller integration values is a sampling clock signal of the optimum phase.

[12] Determination Logic with Weights

In the semiconductor device according to paragraph 11, the determination unit calculates a score for each sampling clock signal to be determined, in which an integration value of a sampling clock signal to be determined is evaluated with a first large weight, and other sampling clock signals are each evaluated with a respective weight which is larger as a respective phase is closer to the sampling clock signal to be determined and which is smaller than the first weight.

[13]

In the semiconductor device according to paragraph 12, a cycle of the determination operation in the second mode is longer than a cycle of the determination operation in the first mode.

[14] Sampling with Synchronization Pattern

In the semiconductor device according to paragraph 13, the serial reception circuit receives the serial signal frame by frame, operates the determination unit in the first mode in response to detection of a synchronization pattern attached before a frame, and operates the determination unit in the second mode in response to detection of a frame delimiter pattern provided at the start of the frame, and a value obtained by multiplying the number of sampling clock signal types by the predetermined number of cycles of the clock signal is smaller than a cycle number of the clock signal in the synchronization pattern.

[15] Data Processing System

A data processing system according to still another embodiment of the invention includes a pair of semiconductor devices for receiving, in synchronization with a clock signal, a serial signal transmitted to each other. Each of the semiconductor devices samples the serial signal in synchronization with multiphase sampling clock signals out of phase with the clock signal, determines based on sampled signals that a sampling phase having little effect of phase variation of the serial signal on a sampling result is an optimum phase, performs a reception operation in which a signal sampled by the optimum phase is reception data, and has, as determination operations for the optimum phase, a first mode and a second mode in which optimality of an optimum phase determined in the first mode is determined based on a sampling result of a reduced number of samplings.

[16] Determination Logic

In the data processing system according to paragraph 15, each of the semiconductor devices integrates the number of times that sampled signals in each group according to the type of sampling phase do not match sample signals of immediately preceding sample phases respectively in a predetermined plurality of cycles of the clock signal, and determines that a sampling phase that is of a smaller integration value and has adjacent sampling phases of smaller integration values is the optimum phase.

[17] Determination Logic with Weights

In the data processing system according to paragraph 16, each of the semiconductor devices calculates a score for each sampling phase to be determined, in which an integration value of a sampling phase to be determined is evaluated with a first large weight, and other sampling clock signals are each evaluated with a respective weight which is larger as a respective phase is closer to the sampling phase to be determined and which is smaller than the first weight.

[18]

In the data processing system according to paragraph 17, a cycle of the determination operation in the second mode is longer than a cycle of the determination operation in the first mode.

[19]

In the data processing system according to paragraph 18, one of the semiconductor devices includes a baseband processor unit (130), and the other semiconductor device includes an analog front end unit (140).

[20]

In the data processing system according to paragraph 18, one of the semiconductor devices includes a baseband processor unit (183), and the other semiconductor device includes an application processor unit (182).

2. Details of Embodiments

Figure 2:
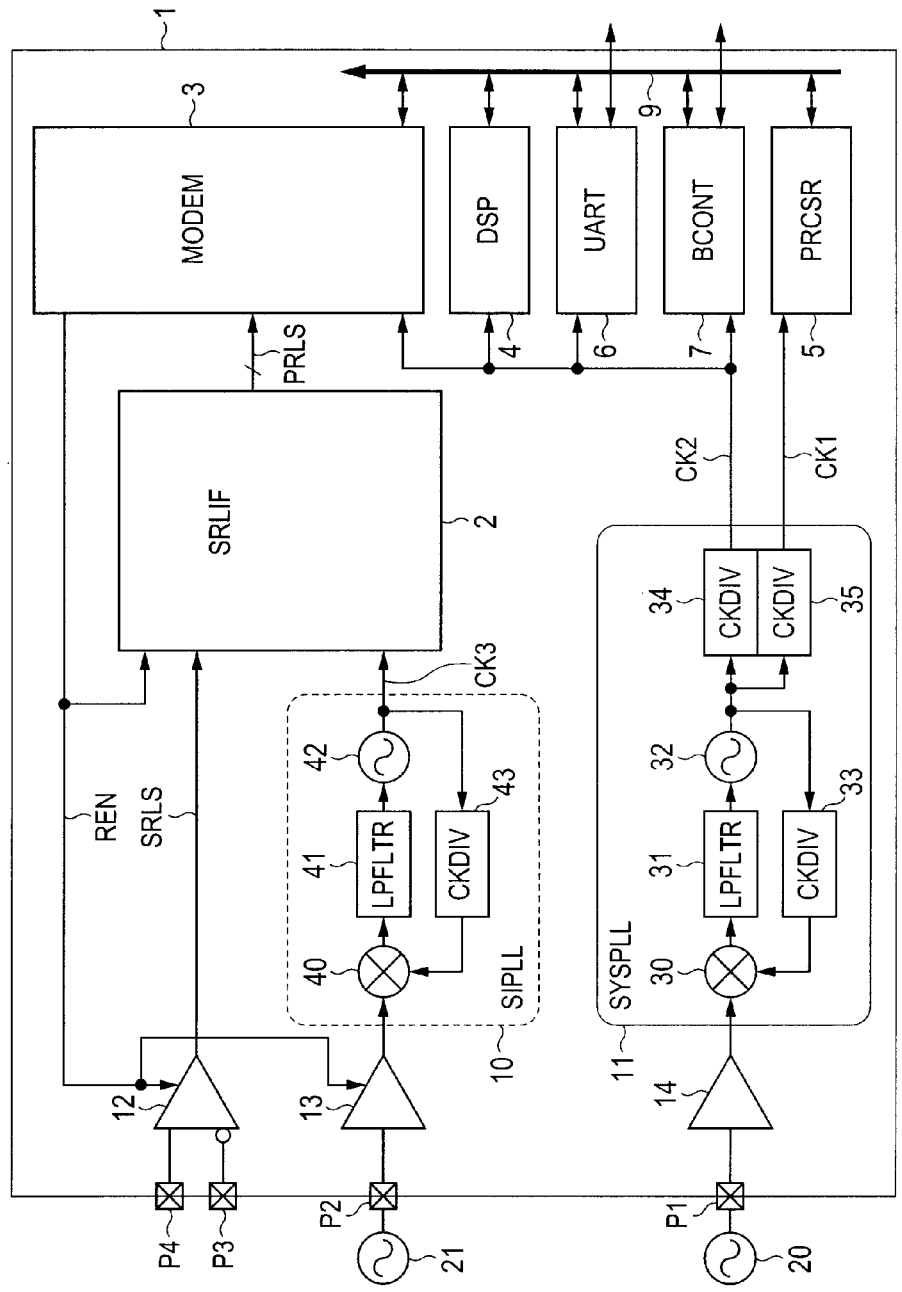
FIG. 2 is a block diagram illustrating a semiconductor device according to an embodiment of the present invention.

FIG. 2 illustrates a semiconductor device according to an embodiment of the invention. The semiconductor device 1 shown in FIG. 2 is formed over a single semiconductor substrate such as monocrystal silicon, using a known complementary MOS integrated circuit manufacturing technology, but is not limited thereto. The semiconductor device 1 includes, for example, a processor function and a digital signal processing function, and is configured as a system-on-chip baseband IC having a high-speed interface function by differential serial communication with another semiconductor device.

The semiconductor device 1 includes a processor core (central processing unit, CPU) 5, a digital signal processing unit such as a MODEM (modulator-demodulator) 3 and a DSP (Digital Signal Processor) 4, a serial reception circuit (SRLIF) 2 for performing serial reception in synchronization with a clock, a UART (Universal Asynchronous Receiver Transmitter) 6 for performing asynchronous transmission/reception, and a bus state controller (BCONT) 7 for performing external bus control. Reference numeral 9 denotes an internal bus. Clock signals CK1 and Ck2 for use in synchronization operations of the processor core 5, the MODEM 3, the DSP 4, the UART 6, and the bus state controller 7 are generated by a PLL (Phase Locked Loop) circuit (SYSPLL) 11 for a system. The PLL circuit 11 receives a clock signal supplied to a clock input buffer 14 from an external clock source 20 coupled to a clock terminal P1. In a feedback system comprised of a phase comparator 30, a loop filter 31, a voltage-controlled oscillator 32, and a frequency divider 33, a clock signal having the frequency and phase maintained constant to the supplied clock signal is generated and frequency-divided by frequency dividers 34 and 35 into a plurality of clock signals having different frequencies or clock signals CK1 and CK2 having the same frequency.

A differential signal reception buffer 12 receives a differential serial signal through differential signal input terminals P3 and P4, and supplies a serial signal SRLS to the serial reception circuit 2. The serial reception circuit 2 extracts data from the serial signal SRLS by oversampling in synchronization with a clock signal CK3, and supplies the data as a parallel signal PRLS to the MODEM 3. The MODEM 3 demodulates the supplied parallel signal PRLS. The clock signal CK3 is generated by a PLL circuit (SIPLL) 10 for a serial interface. The PLL circuit 10 receives a clock signal supplied to a clock input buffer 13 from an external clock source 21 coupled to a clock terminal P2. In a feedback system comprised of a phase comparator 40, a loop filter 41, a voltage-controlled oscillator 42, and a frequency divider 43, a clock signal CK3 having the frequency and phase maintained constant to the supplied clock signal is generated. Though not limited in particular, the activation/deactivation of the serial reception circuit 2, the differential signal reception buffer 12, and the clock input buffer 13 is controlled by a reception interface enable signal REN outputted from the MODEM 3 when a reception operation is required based on an instruction from the processor core 5.

The PLL circuit 10 for the serial interface is a circuit for obtaining a clock frequency for high-speed transmission, and configures a clock generation circuit independent of the PLL circuit 11 for the system, to avoid the following problem. Digital signal processing and digital demodulation by the DSP 4 and the MODEM 3 and instruction execution by the processor core 5 greatly increase and decrease the consumption current, which fluctuates the power supply voltage. The thereby increased jitter of the voltage-controlled oscillator adversely affects the high-speed serial interface of the serial reception circuit 2. This problem can be solved by mounting the PLL circuit 10 for the serial interface separately from the PLL circuit 11 for the system. However, if a PLL circuit that can fulfill the low jitter requirement of the transmission standard can be provided, it is also possible to generate the clock signals for the serial interface and the system in the same PLL circuit. This can further reduce the power consumption of the entire semiconductor device 1 as the baseband IC.

Figure 3:
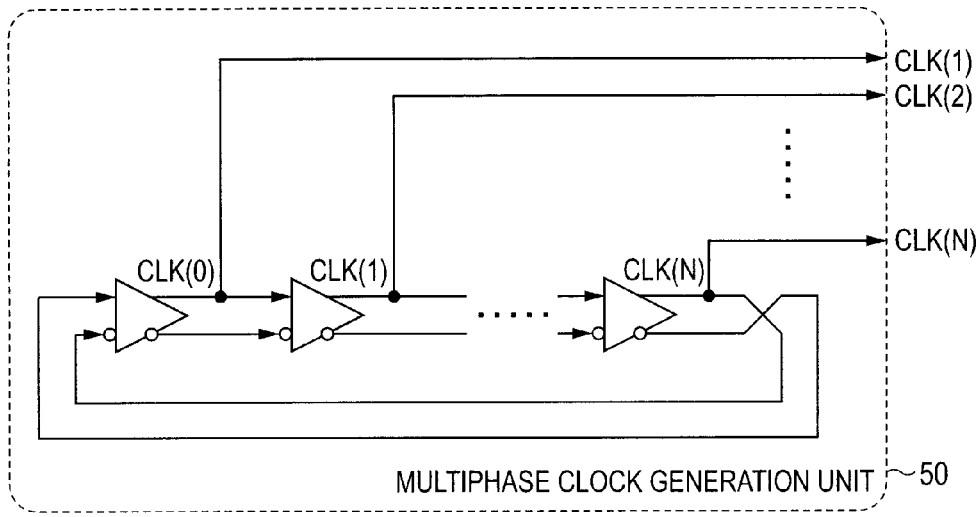
FIG. 3 is a logic circuit diagram illustrating a multiphase clock generation unit comprised of a ring oscillator.
Figure 4:
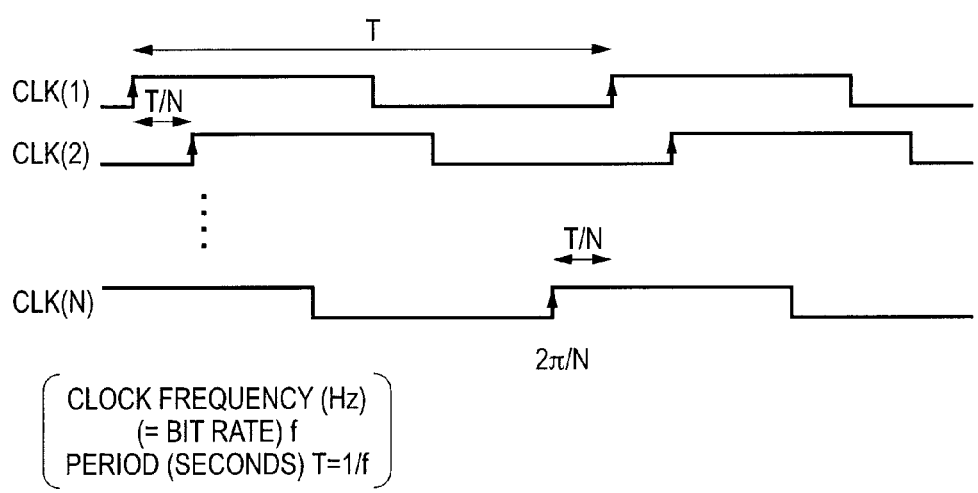
FIG. 4 is a clock waveform chart of sampling clock signals generated by the multiphase clock generation unit of FIG. 3.

FIG. 1 illustrates the configuration of the serial reception circuit 2. A multiphase clock generation unit 50 receives the clock signal CK3 as a reference clock signal. Although it is not necessary to define the phase relationship between the serial signal SRLS and the clock signal CK3, it is necessary to synchronize the frequencies of the two signals. The multiphase clock generation unit 50 generates and outputs clock signals CLK(1) to CLK(N) as N sampling clocks having the same frequency as the clock signal CK3 but being $2\pi/N$ out of phase with one another. In this specification, reference symbol f denotes the frequency of the clock signal CK3 and the clock signals CLK(1) to CLK(N). The multiphase clock generation unit 50 is comprised of a ring oscillator illustrated in FIG. 3 and has, for example, clock waveforms shown in FIG. 4. However, the method of generating the N multiphase clocks is not limited thereto.

In a clock cutoff unit 51, two-input AND gates 60 to 62 receive clock enable signals CE(1) to CE(N) at respective one inputs and perform clock-gating of the clock signals CLK(1) to CLK(N).

In an oversampling unit 52, N flip-flops (FF) 70 to 72 oversample the one serial signal SRLS, using the edges of the N multiphase clock signals CLK(1) to CLK(N), thereby obtaining N pieces of sample data SMPLDAT(1) to SMPLDAT(N).

Based on the sample data SMPLDAT(1) to SMPLDAT(N), a selection signal generation unit 56 determines one of the multiphase clock signals CLK(1) to CLK(N) that has a stable phase relationship, and generates a phase selection signal 84 and the N clock enable signals CE(1) to CE(N) supplied to the clock cutoff unit 51. The stable phase relationship refers to no or little effect of phase variation of the serial signal SRLS on a sampling result based on the sample data SMPLDAT(1) to SMPLDAT(N).

A data selection unit 53 selects, with the phase selection signal, sample data sampled by the sampling clock signal of the sampling phase determined by the selection signal generation unit 56, and outputs it as selection data MUXDAT. A serial-parallel conversion circuit 54 converts the selection data MUXDAT into the parallel signal PRLS with a sampling frequency processable by the subsequent digital signal processing unit.

A burst detection unit 58 detects the start of a burst of the serial signal SRLS to activate a burst detection notification (burst detection signal) 80, and detects the end of the burst to activate a burst end notification (burst end signal) 81. A frame start detection unit 55 detects an SOF (Start Of Frame) and activates a frame start detection notification 85. The term "burst" refers to a state in which one or more bits of continuous serial data are transmitted via a differential link, that is, the differential input terminals P3 and P4. For example, about 1024 bits of serial data are treated as one burst, and there are cases where a longer burst is treated. On the other hand, in this specification, a state in which a bust is not present on the differential link is referred to as "sleep". Further, a frame refers to a data transmission unit defined in communication protocols. The start of a logical frame has a frame delimiter pattern defined as a unique bit string of serial data, and the frame start detection unit 55 verifies the frame delimiter pattern to detect the frame start.

A state machine 57 manages the reception state of the serial signal SRLS and controls the operation of the selection signal generation unit 56 when the reception interface enable signal REN is activated. In response to the activation of the burst detection notification 80, the state machine 57 provides an instruction on an initial phase detection operation for initially determining a sample phase, having a stable phase relationship, of the multiphase clock signals CLK(1) to CLK(N) to the selection signal generation unit 56, with an initial phase detection notification (initial phase detection signal, first detection signal) 82. Further, in response to the activation of the frame start detection notification signal 85, the state machine 57 provides an instruction on a phase tracking operation for updating a stable sample phase against the subsequent effect of long-period jitter of the serial signal SRLS to the selection signal generation unit 56, with a phase tracking notification (phase tracking signal, second detection signal) 83.

Figure 5:
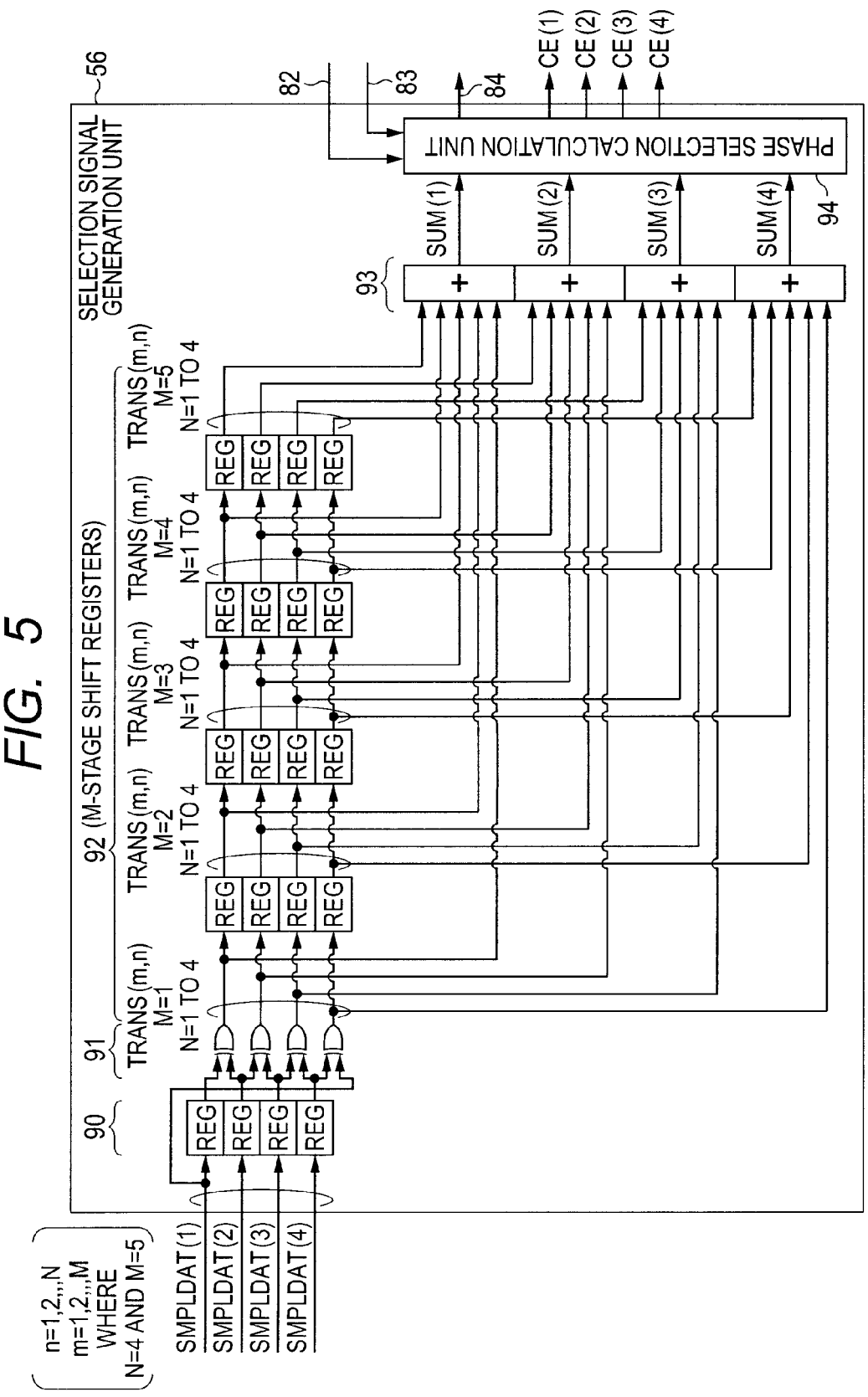
FIG. 5 is a block diagram illustrating the details of a selection signal generation unit.

FIG. 5 illustrates the details of the selection signal generation unit 56. The selection signal generation unit 56 includes an input register circuit 90 which receives N pieces of sample data SMPLDAT(1) to SMPLDAT(N) and latches them with a clock signal (e.g., the clock signal CK3) of the frequency f. There is provided a comparison circuit 91 for comparing, by exclusive OR and in time sequence, adjacent data items of the sample data SMPLDAT(1) to SMPLDAT(N) latched by the input register circuit 90 and the sample data SMPLDAT(1) inputted to the selection signal generation unit 56 in the next clock cycle. With the clock signal of the frequency f, the comparison results are sequentially sent to a shift register circuit 92 and latched. If two pieces of sample data by the adjacent sample phases are different from each other, the corresponding exclusive-OR value of the comparison circuit becomes logical value "1". That is, the value of the serial signal changes between the two sample phases by which the exclusive OR becomes "1". Each reference symbol REG denotes a latch for performing a latch operation with the clock signal of the frequency f. There is provided an adder circuit 93 for adding, with an adder ADD, an input of the shift register circuit 92 and outputs of latch stages in each line of results of exclusive-ORing adjacent pieces of sample data by the comparison circuit 91. The output value of the adder circuit 93 increases with increase in the number of times the serial signal value changes between the two sample phases. The changes of the serial signal value between the two sample phases include a signal change not affected by jitter and a signal change affected by jitter. Consequently, sample data not affected by jitter is data sampled by a sample phase corresponding to the output "0" of the adder circuit 93.

Reference symbol M denotes the number of retroactive comparison results to be added by the adder circuit 93. That is, the line of comparison results by exclusive OR contains M cycles of the clock signal of the frequency f. The duration of M cycles in the serial signal SRLS is also referred to as an integration block. Accordingly, an increase in M increases the accuracy of determining a long-time stable phase, but decreases the speed of response to a time-dependent change in transmission path characteristics (e.g., propagation delay amount in serial transmission). The accuracy of optimum phase determination and the speed of response have a trade-off relationship, and the optimum value of M is determined in consideration of the maximum specification of jitter of serial data and the jitter tolerance of multiphase clock in design.

In an example of FIG. 5, the number N of multiphase clocks=4, and the number M of cycles in the line of comparison results by exclusive OR=5. Four pieces of sample data SMPLDAT(1) to SMPLDAT(4) and sample data of an adjacent phase are sequentially exclusive-ORed, so that the first comparison values TRANS(m, n) (m=1, n=1 to 4) are obtained. The results are sequentially latched by the subsequent four-stage shift register circuit 92, so that the results of comparison values TRANS(m, n) (m=1, n=1 to 4), TRANS (m, n) (m=2, n=1 to 4), TRANS(m, n) (m=3, n=1 to 4), TRANS(m, n) (m=4, n=1 to 4), and TRANS(m, n) (m=5, n=1 to 4) are obtained. These results are grouped as described above, so that four addition values SUM(1) to SUM(N) are obtained and inputted to a phase selection calculation unit 94.

Figure 6:
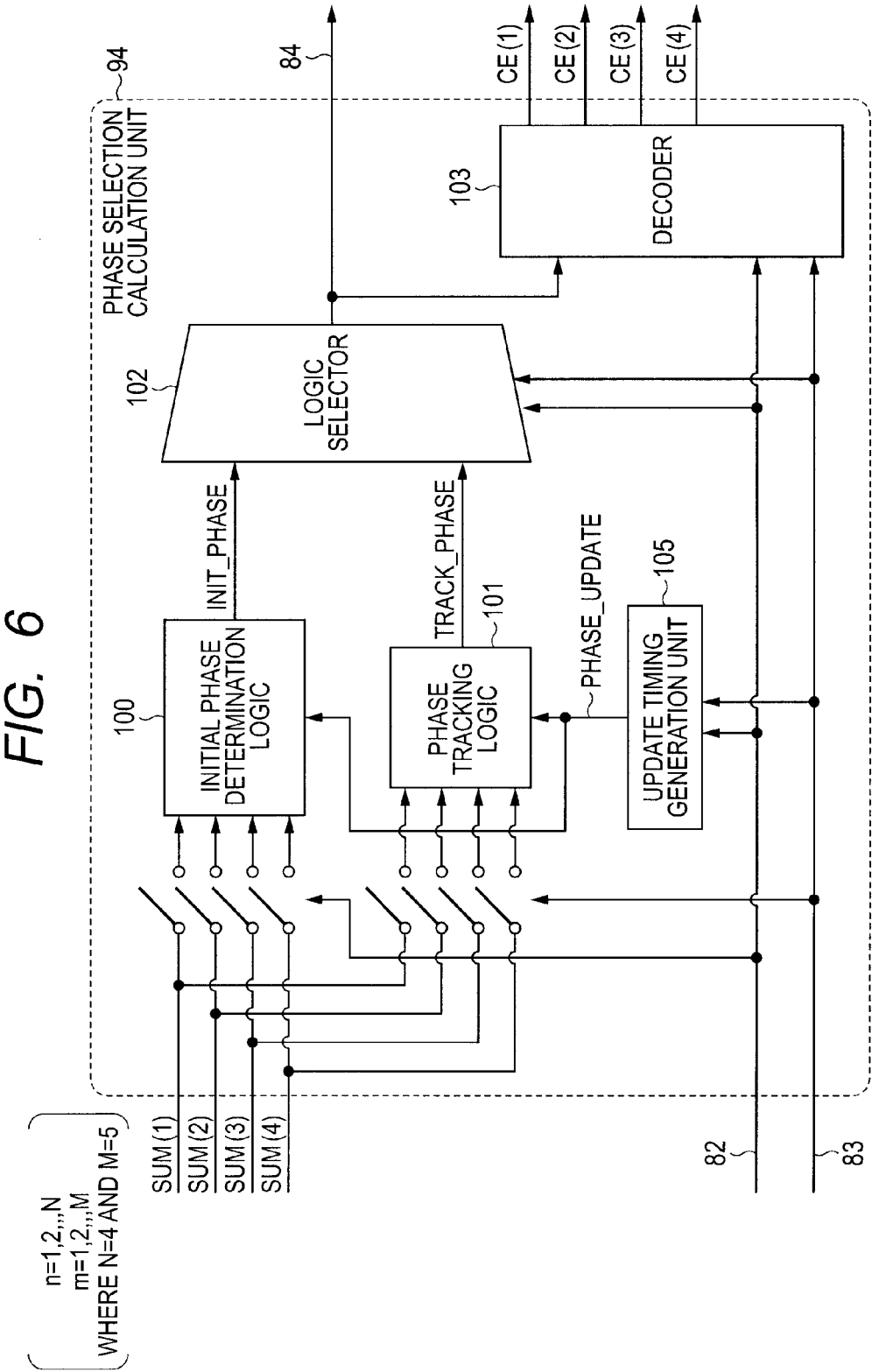
FIG. 6 is a block diagram illustrating the details of a phase selection calculation unit.

FIG. 6 illustrates the details of the phase selection calculation unit 94. In FIG. 6, for the sake of convenience, N=4 and M=5 as in FIG. 5. The addition values SUM(1) to SUM(4) are inputted to two logic circuits which are an initial phase determination logic 100 and a phase tracking logic 101. In brief, the logical composition of the initial phase determination logic 100 and the phase tracking logic 101, though detailed later, is processing for determining one sampling phase having little effect of phase variation of the serial signal SRLS on a sampling result based on the addition values SUM(1) to SUM(4). The initial phase determination logic 100 derives an optimum phase INIT_PHASE, and the phase tracking logic 101 derives an optimum phase TRACK_PHASE. Although details will be described later, in the phase tracking logic 101, the calculation amount for use in determination is reduced as compared to the initial phase determination logic 100.

The phase selection calculation unit 94 receives the initial phase detection notification 82 and the phase tracking notification 83 from the state machine 57 for managing the burst and frame of serial data, and selects and enables the initial phase determination logic 100 or the phase tracking logic 101 through selection switches beforehand. The output result of the logic circuit 100 or 101 selected and enabled by the switches is selected by a logic selector 102 in the subsequent stage. The result selected by the logic selector 102 is supplied as the phase selection signal 84 to the data selection unit 53. A decoder 103 which concurrently receives the phase selection signal 84 generates clock enable signals CE(1) to CE(4) based on the phase selection signal 84, and disables sampling by sample clock signals other than necessary multiphase clock signals, thereby to reduce the consumption current.

Further, an update timing generation unit 105 determines the reception state of the burst, using the initial phase detection notification 82 and the phase tracking notification 83, to determine the calculation periods of the phase selection logics 100 and 101. The phase tracking logic 101 derives TRACK_PHASE in only an integration block in which PHASE_UPDATE is enabled. In this example, in an initial phase detection operation (refer to an initial phase detection state) according to an instruction of the initial phase detection notification 82, PHASE_UPDATE is always enabled, whereas in a phase tracking operation (refer to a phase tracking state) according to an instruction of the phase tracking notification 83, PHASE_UPDATE is enabled only once every plurality of integration blocks, e.g., two integration blocks. This allows TRACK_PHASE to be updated only once every plurality of integration blocks, which can reduce the consumption current in the phase tracking operation. A TRACK_PHASE update period in accordance with required transmission path characteristics is initially set in a control register (not shown) by the processor core 5 or the like before the serial reception circuit 2 operates. The TRACK_PHASE update period can be increased as the frequency of long-period jitter decreases, which can further reduce the consumption current. Even if a calculation method in the phase tracking operation is the same as that of the initial phase determination logic, the power consumption can be reduced. It is also possible to use later-described clock enable control in the phase tracking operation together with the method of performing a calculation for phase tracking only once every plurality of integration blocks.

Figure 8:
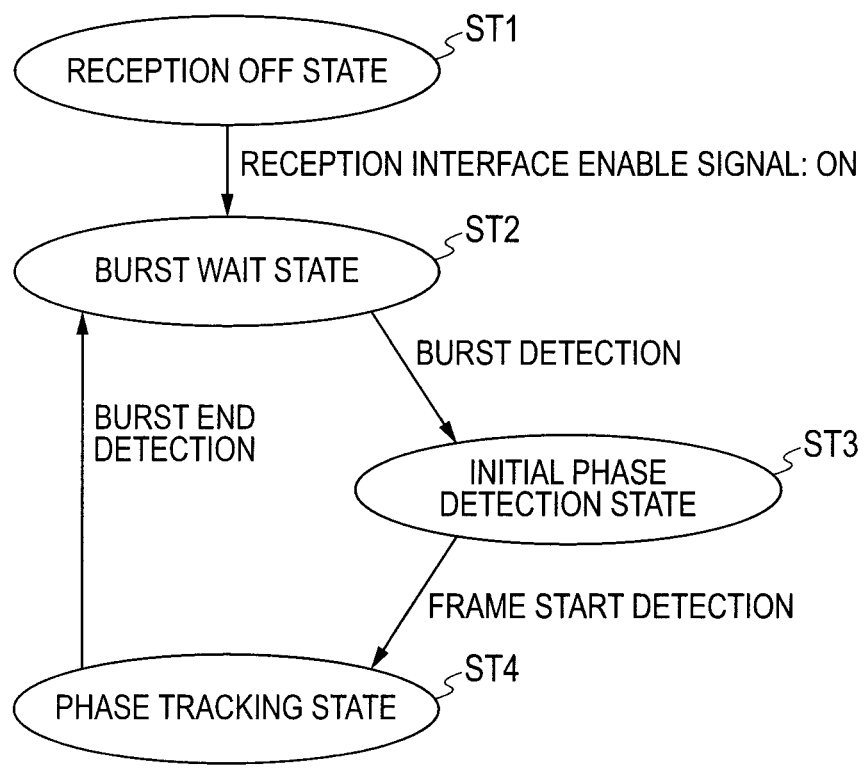
FIG. 8 is a state transition diagram of a state machine.
Figure 9:
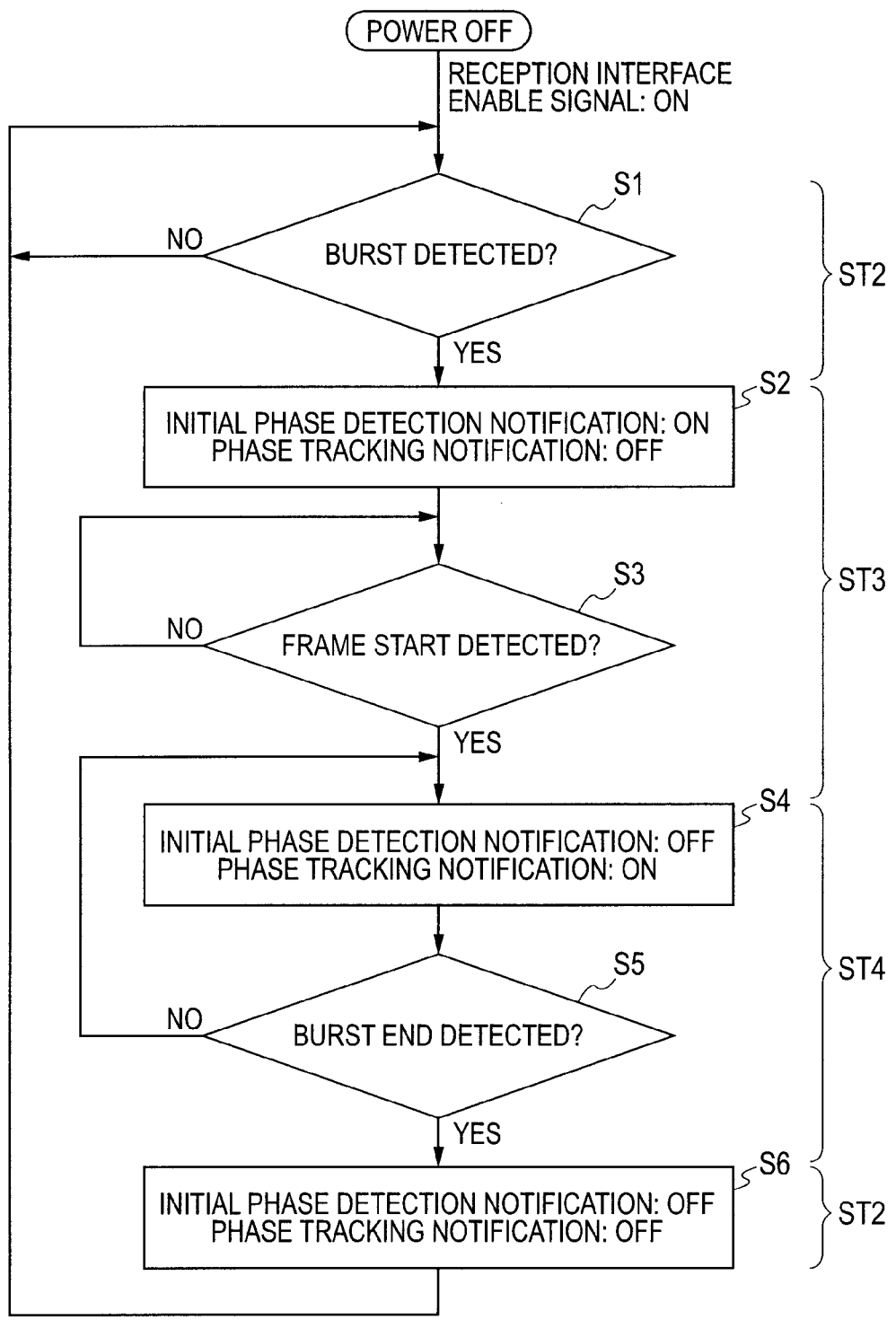
FIG. 9 is a control flow chart of the state machine.

FIG. 8 is a state transition diagram of the state machine 57, and FIG. 9 is a control flow chart of the state machine. When the reception interface enable signal REN is activated, the state machine starts an operation, and a reception OFF state ST1 transitions to a burst wait state ST2. In the burst wait state ST2, the initial phase detection notification 82 and the phase tracking notification 83 are deactivated, and all clock enable signals CE(1) to CE(4) are disabled, thereby reducing the consumption current as much as possible. In the burst wait state ST2, when the burst detection unit 58 detects the burst start of serial data (S1), the state transitions to an initial phase detection state ST3 as a first mode. In the initial phase detection state ST3, the initial phase detection notification 82 is activated, and the phase tracking notification 83 is deactivated (S2), thereby enabling the initial phase determination logic 100. Further, to search for a multiphase clocks having an optimum phase, all the clock enable signals CE(1) to CE(4) are enabled.

In the initial phase detection state ST3, when the frame start detection unit 55 detects the reception of a frame start (S3), the state transitions to a phase tracking state ST4 as a second mode. In the phase tracking state ST4, the initial phase detection notification 82 is deactivated, and the phase tracking notification 83 is activated (S4), thereby enabling the phase tracking logic 101. Further, the decoder 103 in the phase selection calculation unit 94 enables the clock enable signals of a clock of an optimum phase and adjacent clocks, and disables the other clock enable signals. The clock cutoff unit 51 brings only the enabled clock enable signals to an enable level, thereby continuing to track optimum phases while reducing the consumption current.

In the phase tracking state ST4, when the burst detection unit 58 detects the burst end of the serial signal SRLS (S5), the state returns to the burst wait state ST2. In this state, the initial phase detection notification 82 and the phase tracking notification 83 are deactivated, and all the clock enable signals CE(1) to CE(4) are disabled (S6), thereby reducing the consumption current. The state machine waits for the detection of the next burst start.

Figure 11:
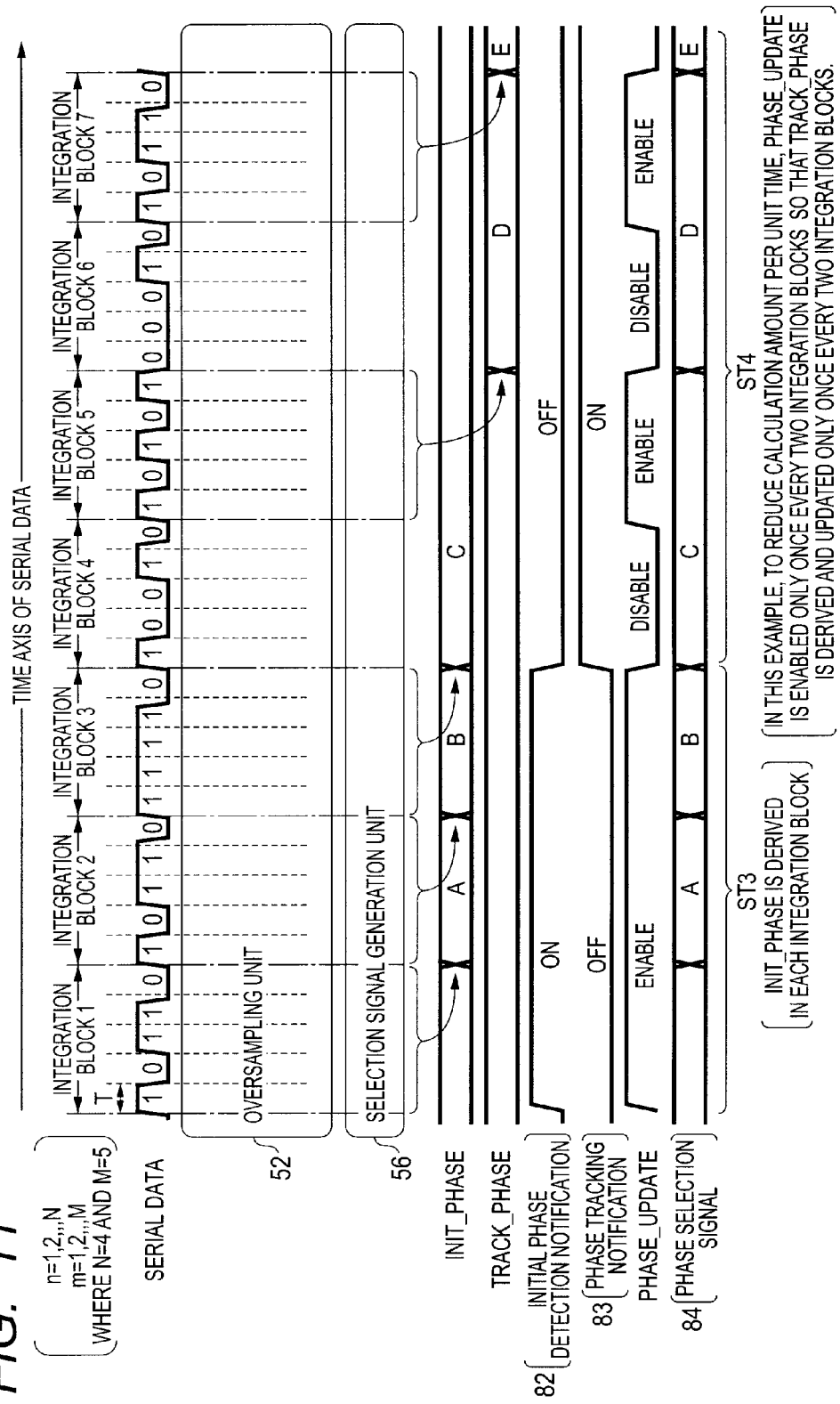
FIG. 11 is an operation timing chart in the case of using two phase selection logics which are an initial phase determination logic and a phase tracking logic.

FIG. 11 is an operation timing chart in the case of using two phase selection logics which are the initial phase determination logic and the phase tracking logic. As illustrated in FIG. 6, the phase selection calculation unit 94 includes the initial phase determination logic 100 and the phase tracking logic 101 as two phase selection logics.

The initial phase determination logic 100 is a phase selection logic for use in the initial phase detection state ST3, and needs to determine an optimum phase INIT_PHASE in a short time from burst detection to frame start detection. The initial phase determination logic 100 performs a calculation for phase selection every integration cycle to determine an optimum phase INIT_PHASE in a short time.

The phase tracking logic 101 is a phase selection logic for use in the phase tracking state ST4, and continues to derive optimum phases until a burst end after frame start detection. By setting a TRACK_PHASE update period to a time sufficiently shorter than an optimum phase changes due to long-period jitter, it is possible to continue to track optimum phases in the phase tracking state ST4.

In the example of FIG. 11, in the initial phase detection state ST3, A, B, and C as optimum phases INIT_PHASE are derived from integration blocks 1, 2, and 3, respectively. Thus, the phase determination logic performs a calculation in each integration block. In the phase tracking state ST4, D and E as optimum phases TRACK_PHASE are derived from integration blocks 5 and 6 respectively in which PHASE_UPDATE is enabled.

Figure 10:
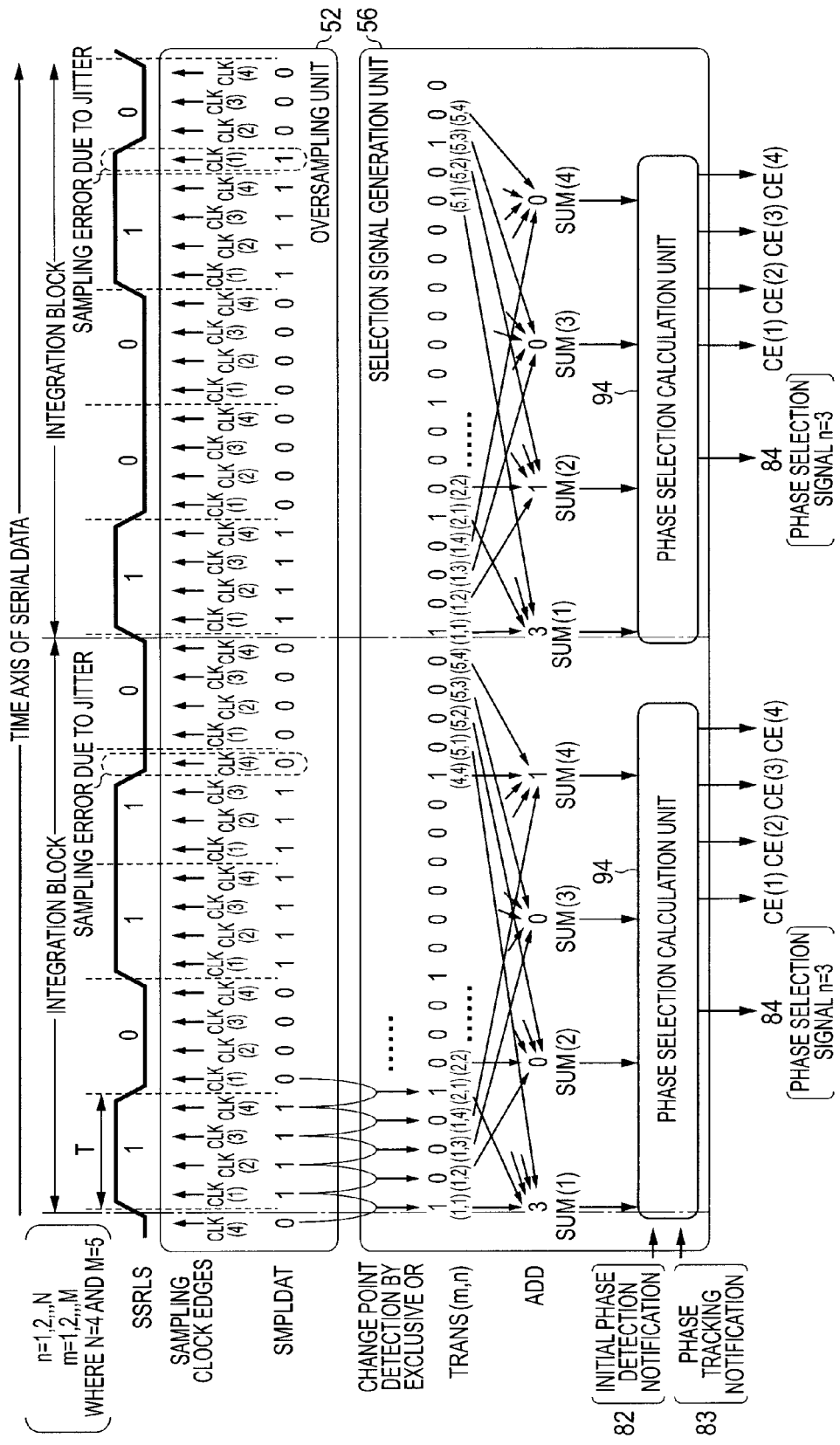
FIG. 10 is a chart illustrating an operation flow of the selection of an optimum phase from the result of oversampling serial data.

FIG. 10 illustrates an operation flow of the selection of an optimum phase from the result of oversampling serial data. In an example of FIG. 10, the number N of multiphase clocks for oversampling=4, and the number M of cycles in the line of comparison results by exclusive OR=5.

An optimum phase selection signal 84 is derived once from the result of oversampling the serial signal SRLS in the past M cycles. The duration of M cycles is referred to as an integration block. In the example of FIG. 10, the integration block corresponds to the duration of five cycles.

A slight change in the period of the serial signal SRLS, for example, due to jitter from the transmission unit of the high-speed serial interface may cause a sampling error if no countermeasure is taken. In an example of FIG. 10, sampling errors due to jitter are suppressed. Since N=4 in this case, four sampling clock signals are used as multiphase clock signals. One cycle (wavelength T) of serial data is oversampled with the edges of the four sampling clock signals, thereby obtaining the sample data SMPLDAT(1) to SMPLDAT(4).

With the comparison circuit 91 and the shift register circuit 92 in the selection signal generation unit 56, two pieces of sample data SMPLDAT by the adjacent sampling clocks are exclusive-ORed, thereby obtaining TRANS(m, n) as change point detection. The results are added, thereby deriving SUM (n) from equation (1).

$$\mathrm{SUM}(n) = \sum_{m=1}^{M} TRANS(m, n) \quad (1)$$

In this example, M=5, n=1, 2, 3, 4, so that SUM(1)=3, SUM(2)=0, SUM(3)=0, SUM(4)=1. These results are inputted to the phase selection calculation unit 94 to derive an optimum phase selection signal 84.

An example of the calculation method in the phase selection logics will now be described. N scores SCORE(n) are calculated from N addition values SUM(n). Phase number n having the minimum of the N scores SCORE(n) is derived as an optimum phase. SCORE(n) is expressed by equation (2).

$$\mathrm{SCORE}(n) = \sum_{l=1}^{L} \{a(l) * \mathrm{SUM}(n+l-2)\} \quad (2)$$
$$L = N - 1$$

where a(l) denotes a weight coefficient, and is a window function which takes on a maximal value at the median value of parameter l and takes on a minimal value at the minimum and maximum values of parameter l. Examples in which a triangular window function is applied to a(l) will be given here. In an example of a(l) in which N=4 (L=3), a(1)=1, a(2)=2, and a(3)=1. In an example of a(l) in which N=6 (L=5), a(1)=1, a(2)=2, a(3)=4, a(4)=2, and a(5)=1. In an example of a(l) in which N=8 (L=7), a(1)=1, a(2)=2, a(3)=4, a(4)=8, a(5)=4, a(6)=2, and a(7)=1.

In these examples, all coefficients a(l) are represented by powers of 2. This makes it possible to obtain a result equivalent to the multiplication of a(l) and SUM(n+l-2) in the bit shift of the binary decimal point, so that the calculation circuit can be simplified.

In equation (2), a(l) and SUM(n+l-2) are multiplied, and the products are summed, thereby obtaining SCORE(n). For example, in the case of obtaining SCORE(1) corresponding to phase number n=1, SUM(1) having the same phase number is multiplied by the largest weight coefficient a(2)=2, and SUM(4) and SUM(2) of the adjacent phase numbers are multiplied by the smaller weight coefficients a(1)=1 and a(3) =1, respectively. Further, SUM(3) of the farthest phase is multiplied by zero.

Thus, SUM(1) having the same phase number as SCORE (1) is multiplied by the largest weight coefficient. This is because the instability of phase number n=1 (how close the edge of the oversampling clock is to the change point of the serial data), that is, SUM(1) is evaluated most highly. As the phase number of SUM(n) becomes far from phase number n=1, the weight coefficient of the multiplier is decreased, thereby reducing the influence while evaluating the instability of adjacent phases. Similar processing is performed to obtain SCORE(2), SCORE(3), and SCORE(4). The calculation results of SCORE(n) when N=4 (L=3) are described below, where n+l-2=0 is replaced by 4, and n+l-2=5 is replaced by 1. SCORE(1)=SUM(4)*a(1)+SUM(1)*a(2)+SUM(2)*a(3) =7, SCORE(2)=SUM(1)*a(1)+SUM(2)*a(2)+SUM(3)*a(3) =3, SCORE(3)=SUM(2)*a(1)+SUM(3)*a(2)+SUM(4)*a(3) =1, SCORE(4)=SUM(3)*a(1)+SUM(4)*a(2)+SUM(1)*a(3) =5. In the above results, for example, SCORE(1) is a value obtained by evaluating the stability of sample data of the sampling clock CLK(1). That is, the addition value SUM(1) indicating the stability of sample data of the sampling clock CLK(1) is multiplied by the large weight coefficient a(2), and the addition values SUM(2) and SUM(4) indicating the stability of sample data of the adjacent sampling clocks CLK(2) and CLK(4) are multiplied by the small weight coefficients a(1) and a(3), thereby obtaining SCORE(1). The above results show that SCORE(3) is the minimum value. This indicates that, as the results of the past five-time samplings, the clock of phase number n=3 is an oversampling clock having the edge farthest from the change point of the serial data. Phase number n=3 is obtained as an optimum phase selection signal.

Based on the optimum phase selection logics, the decode logic of the decoder 103 in FIG. 6 will be described. FIG. 7 illustrates the generation logic of the clock enable signals CE(1) to CE(N) by the decoder 103. In the above description, N=4 for easier understanding; however, in FIG. 7, N=8. In the case of an initial phase detection instruction (initial phase detection ON; TRUE), all clock enable signals CE(1) to CE(8) are activated (HIGH), regardless of the phase selection signal 84. In the case of a phase tracking instruction (phase tracking ON; TRUE), five of the clock enable signals CE(1) to CE(8) are activated (HIGH) in accordance with a sample phase selected by the phase selection signal 84. This corresponds to the case where SCORE(n) is calculated when N=8 and L=3 in equation (2). Assume that long-period jitter may change an optimum phase to an adjacent sample phase at most, which is technically recognized. For example, when the phase selection signal 84 indicates a sample phase (1), the optimum phase may change to an adjacent sample phase (8) or (2); accordingly, the clock enable signals CE(7), CE(8), CE(1) to CE(3) are activated to obtain sample data necessary for calculating SCORE(1), SCORE(8), and SCORE(2) for the sample phases (1), (8), and (2), respectively. Though not shown in the drawings, in the case where the decoder 103 has such decode logic as shown in FIG. 7, for example the phase tracking logic 101 receives decode results of the decoder 103 and performs calculations for phase tracking, using only effective values SUM(n).

Figure 12:
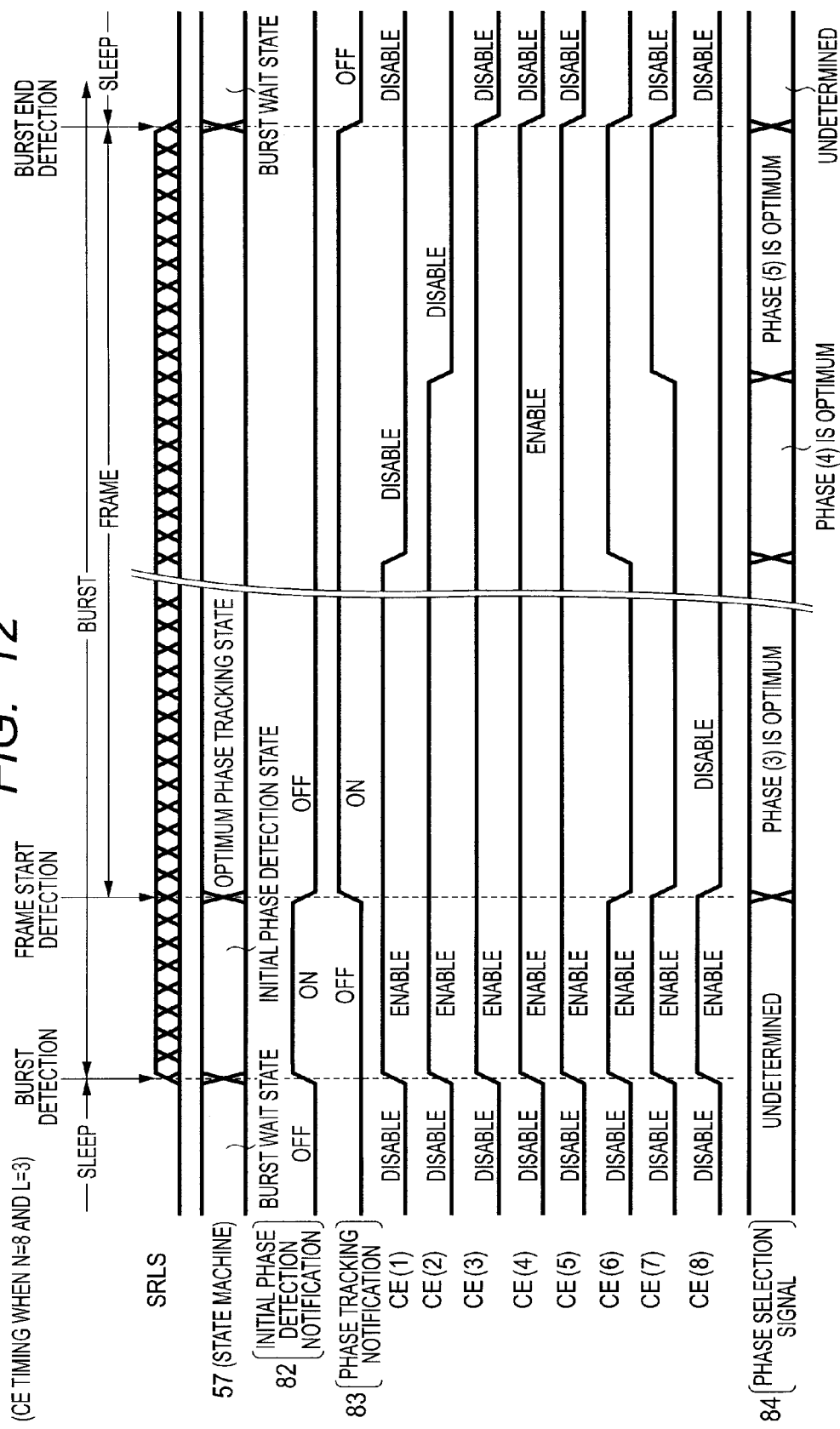
FIG. 12 is a timing chart illustrating change timing of clock enable signals in the case where N=8 and L=3.

FIG. 12 illustrates change timing of clock enable signals in the case where N=8 and L=3. In an initial phase state after the burst start of serial data is detected in a sleep state, all the clock enable signals CE(1) to CE(8) are activated (enabled), and the initial phase determination logic 100 performs a logic calculation for initial phase generation, using all sample data. As a result, e.g., the sample phase 3 of CLK(3) is determined to be an optimum phase. In an optimum phase tracking state after the reception of a frame start is detected, the clock enable signals CE(1) to CE(5) necessary to obtain sample data for calculating SCORE(3), SCORE(2), and SCORE(4) for the sample phase 3 of CLK(3) and the adjacent sample phases 2 and 4 are activated, and the phase tracking logic 101 performs a logic calculation for phase tracking, using the thereby obtained sample data. As a result, e.g., the sample phase 4 of CLK(4) is determined to be an optimum phase. Then, in the optimum phase tracking state, the clock enable signals CE(2) to CE(6) necessary to obtain sample data for calculating SCORE(4), SCORE(3), and SCORE(5) for the sample phase 4 of CLK(4) and the adjacent sample phases 3 and 5 are activated, and the phase tracking logic 101 performs a logic calculation for phase tracking, using the thereby obtained sample data. As a result, e.g., the sample phase 5 of CLK(5) is determined to be an optimum phase. Then, when a burst end is detected, the state returns to the burst wait state (sleep state), and the clock enable signals CE(1) to CE(8) are deactivated (disabled).

By adopting the calculation method in which the phase tracking logic uses only sample data obtained by activating only some clock enable signals, the calculation amount in optimum phase tracking can be reduced so that the power consumption can be reduced. By concurrently adopting the method of performing a logic calculation for phase tracking at a rate of once every plurality of integration blocks, the power consumption can further be reduced.

Figure 13:
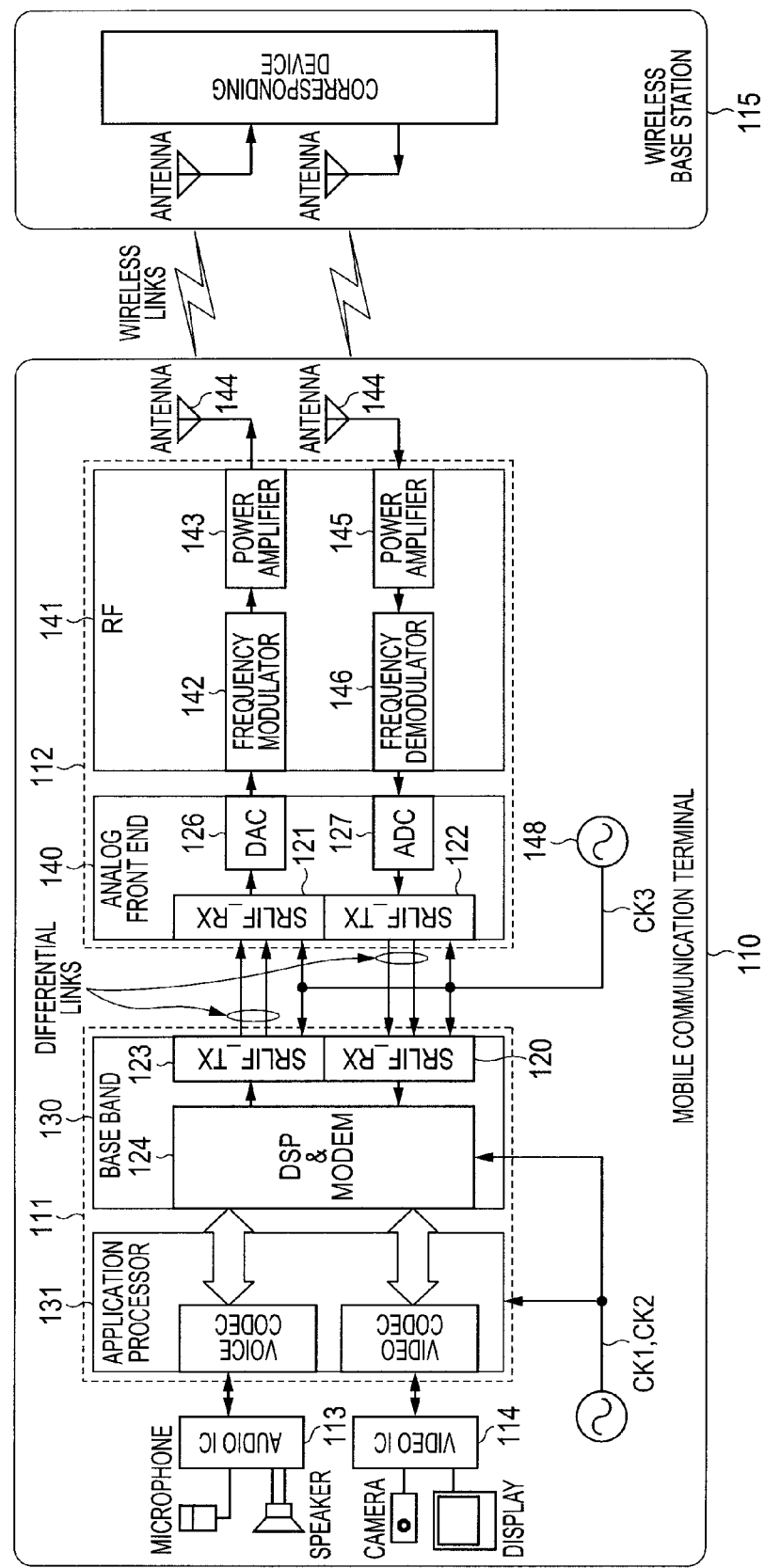
FIG. 13 is a block diagram illustrating a digital mobile phone system as a data processing system to which the serial reception circuit according to this embodiment is applied.

FIG. 13 illustrates a digital mobile phone system as a data processing system to which the serial reception circuit 2 described in the above embodiment is applied. In FIG. 13, the serial reception circuit 2 is applied for high-speed serial transmission between a baseband IC 111 and an analog front end IC 112 as semiconductor devices in a mobile communication terminal 110 capable of next-generation high-speed digital wireless communication. Serial reception circuits (SRLIF_RX) 120 and 121 correspond to the serial reception circuit 2. Serial transmission circuits 122 and 123 are coupled to the serial reception circuits 120 and 121 through differential serial signal lines, thus configuring differential links. The transmission speed of the differential links is, for example, 1456 Mbps. The baseband IC 111 is comprised of a baseband unit 130 and an application processor unit 131, and the baseband unit 130 is comprised of the serial reception circuit 120, the serial transmission circuit 123, and a digital signal processing unit 124 comprised of a DSP and a MODEM. The application processor unit 131 has a processor core and implements the functions of a voice codec and a video codec to interface with an audio IC 113 and a video IC 114 provided outside. The analog front end IC 112 has an analog front end unit 140 and an RF unit 141, and the analog front end unit 140 has the serial reception circuit 121, the serial transmission circuit 122, a digital-analog conversion circuit (DAC) 126 for converting a digital signal from the serial reception circuit 121 into an analog signal, and an analog-digital conversion circuit (ADC) 127 for converting an analog signal into a digital signal and outputting the digital signal to the serial transmission circuit 122. The RF unit 141 is comprised of a frequency modulator 142 for frequency-modulating an output of the DAC 126, a power amplifier 143 for power-amplifying an output of the frequency modulator 142 and driving an antenna 144, a power amplifier 145 for amplifying a signal received by an antenna 144, and a frequency demodulator 146 for frequency-demodulating an amplified output of the power amplifier 145 and supplying the demodulated signal to the ADC 127. The synchronization clock signal CK3 used for the differential links is supplied from an oscillator 148. Though not limited in particular, the clock signal CK3 is separated from the other clock signals CK1 and CK2. The mobile communication terminal 110 performs mobile communication with a wireless base station 115.

Figure 14:
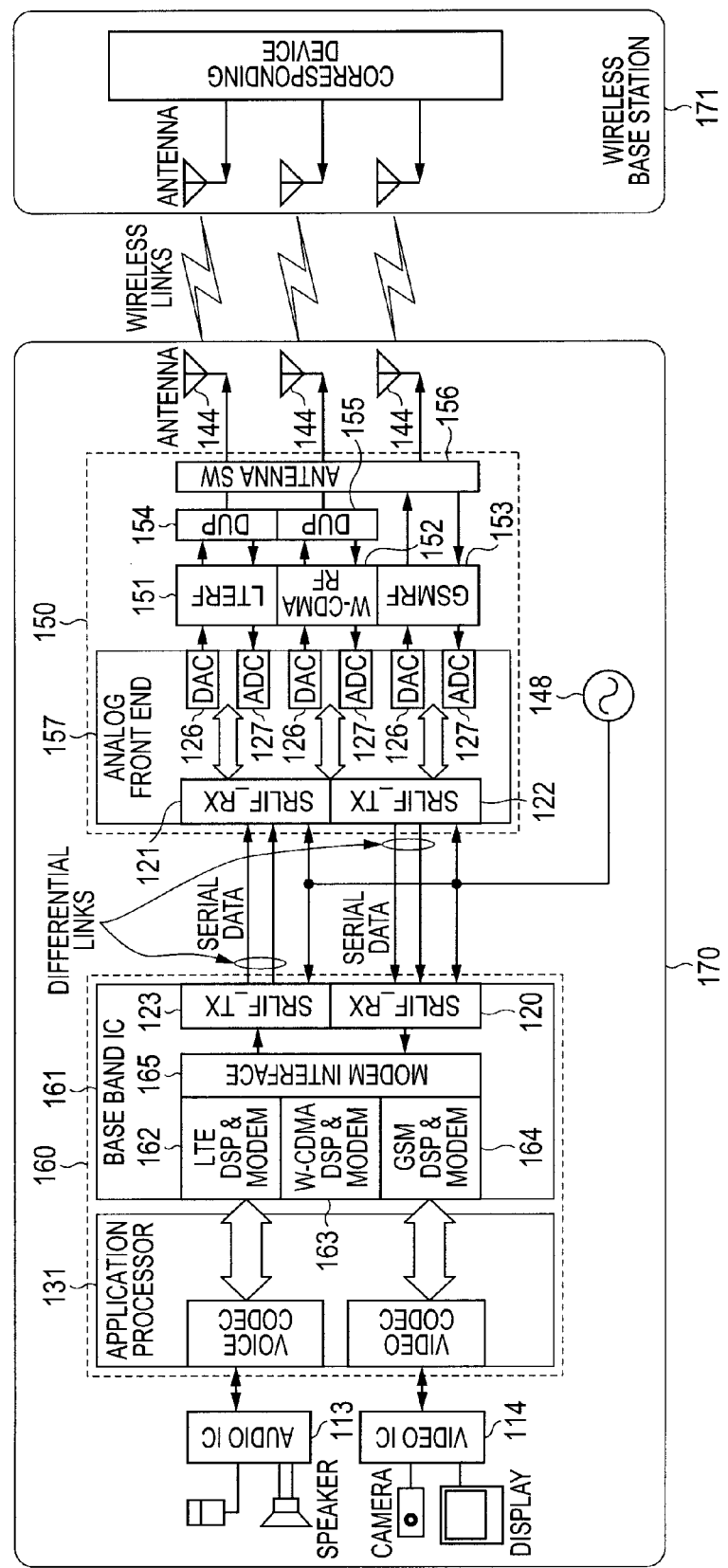
FIG. 14 is a block diagram illustrating a multi-RAT system as a data processing system to which the serial reception circuit according to this embodiment is applied.

FIG. 14 illustrates a multi-RAT system as a data processing system to which the serial reception circuit 2 described in the above embodiment is applied.

There have been proposed various communication methods for mobile phones. GSM (Global System for Mobile Communications) is one of the digital wireless communication methods of the second generation mobile phone system, and is advantageously used in many countries, particularly in Europe and Asia. W-CDMA (Wideband-CDMA) is one of the communication methods of the third generation mobile phone. Since CDMA (Code Division Multiple Access) is adopted as the multiplexing method, W-CDMA has high immunity to radio wave interference and can characteristically accommodate many users on one carrier wave at a time. LTE (Long Term Evolution) is one of the new communication methods of mobile phones expected to become commercially practical around the world from 2010. Since the use frequency band of LTE is supposed to be the same as that of the third generation mobile phone, LTE is occasionally called the 3.9th generation. OFDMA (Orthogonal Frequency Division Multiplexing Access) is adopted as a multiplexing method for download, and SC-FDMA (Single Carrier-Frequency Division Multiple Access) is adopted as a multiplexing method for upload. Further, the application of a multi-antenna technique such as MIMO (Multi Input Multi Output) can characteristically achieve very fast packet communication.

In recent years, it has been common for Japanese mobile phone terminals as well to mount a baseband IC which supports a plurality of communication methods to be a global roaming-capable terminal. FIG. 14 shows a mobile communication terminal 170 and a wireless base station 171 as an example of the multi-RAT (Radio Access Technology) system which supports the above three communication methods. In the mobile communication terminal 170 of FIG. 14, the serial reception circuit 2 is applied for high-speed serial transmission between a baseband IC 160 and an analog front end IC 150 as semiconductor devices. The serial reception circuits (SRLIF_RX) 120 and 121 correspond to the serial reception circuit 2. The serial transmission circuits 122 and 123 are coupled to the serial reception circuits 120 and 121 through differential serial signal lines, thus configuring differential links. The transmission speed of the differential links is, for example, 1456 Mbps. The baseband IC 160 is comprised of a baseband unit 161 and the application processor unit 131, and the baseband unit 161 is comprised of the serial reception circuit 120, the serial transmission circuit 123, a MODEM interface 165, a digital signal processing unit 162 comprised of a DSP and a MODEM for LTE, a digital signal processing unit 163 comprised of a DSP and a MODEM for W-CDMA, and a digital signal processing unit 164 comprised of a DSP and a MODEM for GSM. The application processor unit 131 has a processor core and implements the functions of a voice codec and a video codec to interface with the audio IC 113 and the video IC 114 provided outside. The analog front end IC 150 has an analog front end unit 157, an RF unit 151 for LTE, an RF unit 152 for W-CDMA, an RF unit 153 for GSM, duplexers 154 and 155 for transmission/reception antennas, and an antenna switch 156. The analog front end unit 157 has the serial reception circuit 121, the serial transmission circuit 122, the digital-analog conversion circuit (DAC) 126, and the analog-digital conversion circuit (ADC) 127. The RF units 151, 152, and 153 are each comprised of a frequency modulator, a power amplifier for power-amplifying an output of the frequency modulator, a power amplifier for amplifying a received radio-frequency signal, and a frequency demodulator for frequency-demodulating an amplified output of the power amplifier. The synchronization clock signal CK3 used for the differential links is supplied from the oscillator 148. The mobile communication terminal 170 performs mobile communication with the wireless base station 171, in accordance with an LTE, W-CDMA, or GSM protocol.

Figure 15:
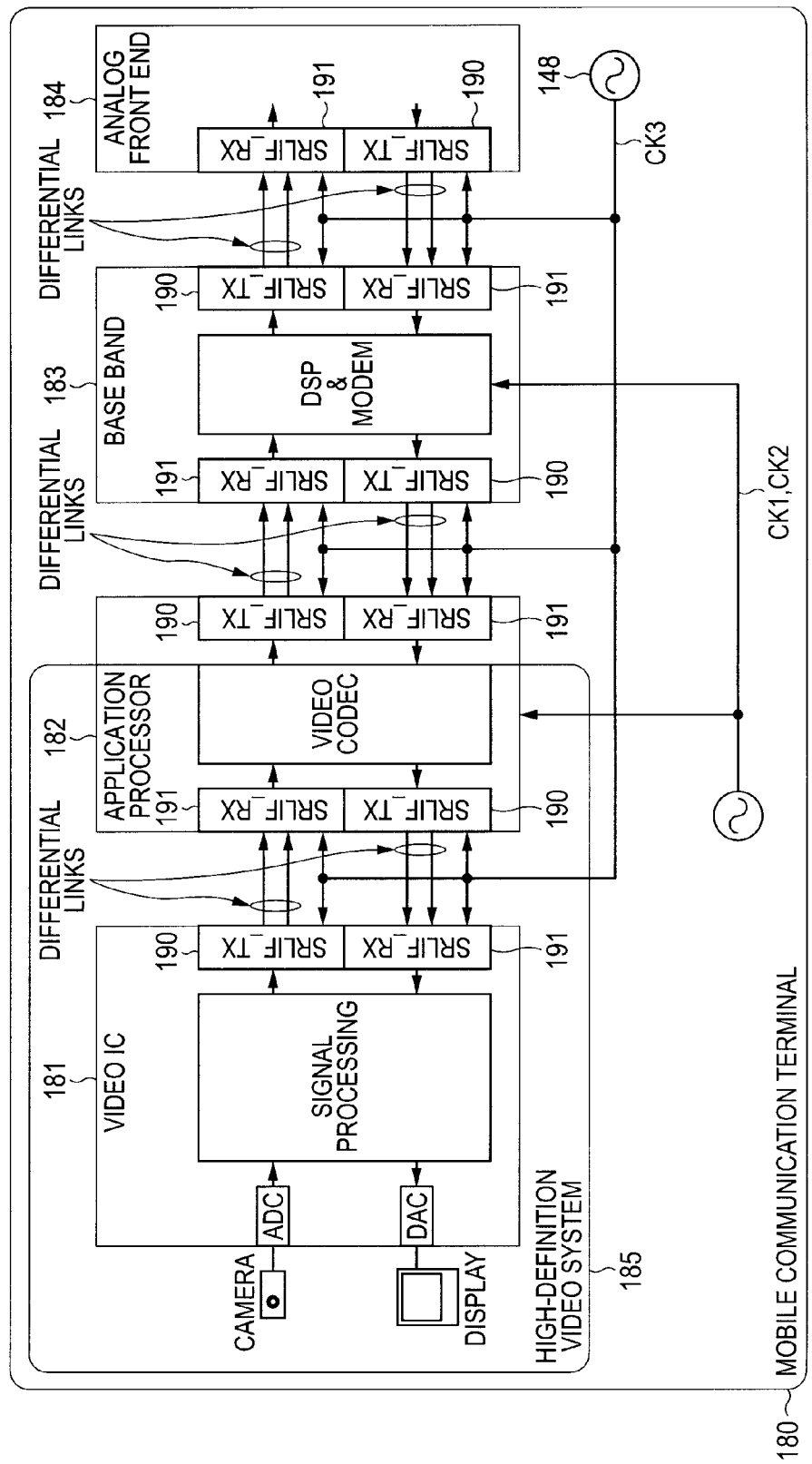
FIG. 15 is a block diagram illustrating showing an example in which the serial reception circuit according to this embodiment is applied to interfaces between devices of a mobile communication terminal.

FIG. 15 is a block diagram showing an example in which the serial reception circuit 2 described in the above embodiment is applied to interfaces between devices of a mobile communication terminal. The mobile communication terminal 180 includes a video IC 181, an application processor 182, a baseband IC 183, and an analog front end IC 184 which are individual semiconductor devices, and the serial reception circuit 2 is applied for high-speed serial transmission between respective semiconductor devices. A serial reception circuit (SRLIF_RX) 191 corresponds to the serial reception circuit 2. A serial transmission circuit 190 is coupled to the serial reception circuit 191 through differential serial signal lines, thus configuring a differential link. The semiconductor devices may be enclosed in mutually different packages. Alternatively, two or more of the semiconductor devices may be enclosed in one package. In either case, semiconductor devices are coupled to each other through the serial reception circuit. The transmission speed of the differential link is, for example, 1456 Mbps. The oscillator 148 of the clock signal CK3 for use in serial communication through the differential link is separated from the other clock signals CK1 and CK2.

According to the above-described serial reception circuit, the following operational effects can be obtained.

(1) By oversampling with multiphase clock signals, it is possible to obtain an ideal reception signal with high-speed lockup from an input serial signal.

(2) Since the state machine manages the reception state of a burst, it is possible to disable unnecessary multiphase sampling clock signals to reduce the consumption current. In the phase tracking state, a clock signal of an optimum sample phase and necessary clock signals of adjacent phases are enabled, and the other multiphase sampling clock signals are disabled, thereby making it possible to reduce the consumption current. Further, by enabling the optimum sample phase and the adjacent sampling clock signals, it is possible to respond and track slow time-dependent change (long-period jitter) in the phase relationship between the reference clock and the input serial signal. When the end of the burst is detected, all clock enable signals are disabled, thereby making it possible to further reduce the consumption current.

(3) Since the state machine manages the reception state of a burst, it is possible to switch between the optimum phase selection logics. In the initial phase detection state which requires high-speed synchronization, the phase selection logic that can derive an optimum phase in a short time is used. In the phase tracking state of slow change in reception characteristics, the method for reducing the consumption current is used, thereby making it possible to reduce the consumption current.

(4) In the initial phase detection state, all the multiphase sampling clock signals are enabled, and the phase selection logic having a large calculation amount is used, thereby making it possible to achieve high-speed synchronization. In the phase tracking state, the clock signals of the currently selected phase and adjacent phases of all the multiphase sampling clock signals are enabled, and the other clock signals are disabled, thereby to reduce the consumption current. At this time, phase selection as shown in FIG. 7 for tracking change in the phase relationship between the received serial data and the sampling clock edge is performed, thereby obtaining the capability to track long-period jitter.

(5) It is possible to determine an optimum phase as needed even during burst reception at a reasonable consumption current to dynamically switch data selection.

(6) It is possible to satisfy requirements of a small consumption current, high-speed lockup to a reception signal, and the capability of long-time phase tracking in CDR or the like.

While the invention made above by the present inventors has been described specifically based on the illustrated embodiments, the present invention is not limited thereto. It is needless to say that various changes and modifications can be made thereto without departing from the spirit and scope of the invention.

For example, the serial reception circuit according to the invention can be widely applied to signal processing methods in reception circuits of high-speed serial transmission used between devices. For example, the serial reception circuit is applicable to expansion buses (Serial-ATA, PCI-Express, USB, IEEE1394) of personal computers and workstations, interfaces (DigRF, Unipro) between devices of mobile phone terminals, wired digital transmission interfaces (OBSAI, CPRI), and other products of high-speed differential signal serial communication.

The values of N, M, and L described in the calculation processing of an optimum sampling phase in the oversampling method are not limited thereto but can be changed.

Even in a phase interpolation method that dose not have the capability to track wander, e.g., a known pattern comparison method, it is possible to reduce the power consumption by disabling some clock signals. In a transmission path specification that does not require clock wander tracking which is not available in the method, it is possible to configure a high-efficiency transmission circuit having a smaller power consumption.

What is claimed is:

1. A semiconductor device comprising a serial reception circuit for receiving a serial signal in synchronization with a clock signal, wherein the serial reception circuit:

samples the serial signal in synchronization with multiphase sampling clock signals out of phase with the clock signal;

determines, based on sampled signals, an optimum phase of the clock signal which is a sampling phase having little effect of phase variation of the serial signal on a sampling result; and performs a reception operation to determine a reception data by sampling a signal using the optimum phase of the clock signal, wherein the serial reception circuit determines optimum phase of the clock signal by a first and a second determination mode, wherein in the first determination mode, the serial reception circuit determines an optimum phase of the clock signal based on the multiphase sampling clock signals, and wherein in the second determination mode, the serial reception circuit determines an optimum phase of the clock signal based on the optimum phase of the clock signal determined in the first mode and at least a first and a second phase of the clock signal adjacent to the optimum phase of the clock signal determined in the first determination mode, wherein a number of sampling phases used in the second determination mode is less than a number of sampling phases used in the first determination mode.

2. The semiconductor device according to claim 1, wherein a cycle of a determination operation in the second mode is longer than a cycle of a determination operation in the first mode.

3. The semiconductor device according to claim 2, wherein the serial reception circuit integrates the number of times that sampled signals in each group of sampling phase types do not match sample signals of immediately preceding sample phases, respectively, in a predetermined plurality of cycles of the clock signal, and determines that a sampling phase that is of a smaller integration value and has adjacent sampling phases of smaller integration values is the optimum phase.

4. The semiconductor device according to claim 3, wherein the serial reception circuit calculates a score for each sampling phase to be determined, and an integration value of a sampling phase to be determined is evaluated with a first weight, and other sampling clock signals are each evaluated with a respective weight which is larger as a respective phase is closer to the sampling phase to be determined, each respective weight being smaller than the first weight.

5. The semiconductor device according to claim 4, wherein the serial reception circuit receives the serial signal frame by frame, makes a determination of the first mode using a synchronization pattern attached before a frame, and makes a determination of the second mode by detecting a frame delimiter pattern provided at the start of the frame.

6. The semiconductor device according to claim 5,
wherein the serial reception circuit includes:
an oversampling unit for sampling the serial signal in synchronization with the multiphase sampling clock signals out of phase with the clock signal;
a determination unit for determining based on sample data sampled by the oversampling unit that one sampling phase having little effect of phase variation of the serial signal on a sampling result is the optimum phase;
a selection unit for selecting a signal, as the reception data, sampled by a sampling clock signal of the optimum phase determined by the determination unit; and
a control unit for operating the determination unit in the first determination mode in response to detection of the synchronization pattern and operating the determination unit in the second determination mode in response to detection of the frame delimiter pattern.

7. The semiconductor device according to claim 6, wherein the determination unit integrates the number of times that sample data items in each group according to the sampling clock signal types do not match sample data items of immediately preceding phases, respectively, in a predetermined plurality of cycles of the clock signal, and determines that a sampling clock signal that is of a smaller integration value and has adjacent phase sampling clock signals of smaller integration values is a sampling clock signal of the optimum phase.

8. The semiconductor device according to claim 7, wherein the determination unit calculates a score for each sampling clock signal to be determined, and an integration value of a sampling clock signal to be determined is evaluated with a first weight, and other sampling clock signals are each evaluated with a respective weight which is larger as a respective phase is closer to the sampling clock signal to be determined, each respective weight being smaller than the first weight.

9. The semiconductor device according to claim 8, wherein a value obtained by multiplying the number of sampling clock signal types by the predetermined number of cycles of the clock signal is smaller than a cycle number of the clock signal in the synchronization pattern.

10. A semiconductor device comprising a serial reception circuit for receiving a serial signal in synchronization with a clock signal,
wherein the serial reception circuit includes:
an oversampling unit for sampling the serial signal in synchronization with multiphase sampling clock signals out of phase with the clock signal;
a determination unit for determining an optimum phase of the clock signal based on sample data sampled by the oversampling unit, the optimum phase of the clock signal being a sampling phase having little effect of phase variation of the serial signal on a sampling result;
a selection unit for selecting a signal, as reception data, sampled by a sampling clock signal of the optimum phase determined by the determination unit; and
a control unit for operating the determination unit in a first mode in response to input detection of the serial signal, and operating the determination unit in a second mode in response to detection of a predetermined pattern contained in the serial signal,
wherein in the first mode, the determination unit determines an optimum phase of the clock signal based on the multiphase sampling clock signals,
wherein in the second mode, the determination unit determines an optimum phase of the clock signal based on the optimum phase of the clock signal determined in the first mode and at least a first and a second phase of the clock signal adjacent to the optimum phase of the clock signal determined in the first determination mode, and
wherein a number of sampling phases used in the second determination mode is less than a number of sampling phases used in the first determination mode.

11. The semiconductor device according to claim 10, wherein the determination unit integrates the number of times that sample data items in each group of sampling clock signal types do not match sample data items of immediately preceding phases, respectively, in a predetermined plurality of cycles of the clock signal, and determines that a sampling clock signal that is of a smaller integration value and has adjacent phase sampling clock signals of smaller integration values is a sampling clock signal of the optimum phase.

12. The semiconductor device according to claim 11, wherein the determination unit calculates a score for each sampling clock signal to be determined, and an integration value of a sampling clock signal to be determined is evaluated with a first weight, and other sampling clock signals are each evaluated with a respective weight which is larger as a respective phase is closer to the sampling clock signal to be determined, each respective weight being smaller than the first weight.

13. The semiconductor device according to claim 12, wherein a cycle of the determination operation in the second mode is longer than a cycle of the determination operation in the first mode.

14. The semiconductor device according to claim 13,
wherein the serial reception circuit receives the serial signal frame by frame, operates the determination unit in the first determination mode in response to detection of a synchronization pattern attached before a frame, and operates the determination unit in the second determination mode in response to detection of a frame delimiter pattern provided at the start of the frame, and
wherein a value obtained by multiplying the number of sampling clock signal types by the predetermined number of cycles of the clock signal is smaller than a cycle number of the clock signal in the synchronization pattern.

15. A data processing system comprising a pair of semiconductor devices for receiving, in synchronization with a clock signal, a serial signal transmitted to each other,
wherein each of the semiconductor devices:
samples the serial signal in synchronization with multiphase sampling clock signals out of phase with the clock signal;
determines an optimum phase of the clock signal based on sampled signals, the optimum phase being a sampling phase having little effect of phase variation of the serial signal on a sampling result;

performs a reception operation to determine a reception data by sampling a signal using the optimum phase;

determines optimum phase of the clock signal by a first and a second determination mode, wherein, in the first determination mode, an optimum phase of the clock signal is determined based on the multiphase sampling clock signals, wherein, in the second determination mode, an optimum phase of the clock signal is determined based on the optimum phase of the clock signal determined in the first mode and at least a first and a second phase of the clock signal adjacent to the optimum phase of the clock signal determined in the first determination mode, wherein a number of sampling phases used in the second determination mode is less than a number of sampling phases used in the first determination mode.

16. The data processing system according to claim 15, wherein each of the semiconductor devices integrates the number of times that sampled signals in each type of sampling phase groups do not match sample signals of immediately preceding sample phases, respectively, in a predetermined plurality of cycles of the clock signal, and determines that a sampling phase that is of a smaller integration value and has adjacent sampling phases of smaller integration values is the optimum phase.

17. The data processing system according to claim 16, wherein each of the semiconductor devices calculates a score for each sampling phase to be determined, and an integration value of a sampling phase to be determined is evaluated with a first weight, and other sampling clock signals are each evaluated with a respective weight which is larger as a respective phase is closer to the sampling phase to be determined, each respective weight being smaller than the first weight.

18. The data processing system according to claim 17, wherein a cycle of the determination operation in the second determination mode is longer than a cycle of the determination operation in the first determination mode.

19. The data processing system according to claim 18, wherein one of the semiconductor devices includes a baseband processor unit, and the other semiconductor device includes an analog front end unit.

20. The data processing system according to claim 18, wherein one of the semiconductor devices includes a baseband processor unit, and the other semiconductor device includes an application processor unit.

* * * * *